(12) United States Patent
Guha et al.

(10) Patent No.: US 11,088,147 B2
(45) Date of Patent: Aug. 10, 2021

(54) APPARATUS WITH DOPED SURFACES, AND RELATED METHODS WITH IN SITU DOPING

(71) Applicant: Micron Technology, Inc., Boise, ID (US)

(72) Inventors: Jaydip Guha, Boise, ID (US); Saurabh Keshav, Boise, ID (US); Srinivas Pulugurtha, Boise, ID (US); Mohd Kamran Akhtar, Boise, ID (US); James B. Franek, Boise, ID (US); Alex J. Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/453,788

(22) Filed: Jun. 26, 2019

(65) Prior Publication Data
US 2020/0411529 A1    Dec. 31, 2020

(51) Int. Cl.
*H01L 27/108* (2006.01)
*H01L 21/263* (2006.01)
*H01L 21/223* (2006.01)

(52) U.S. Cl.
CPC ...... *H01L 27/10876* (2013.01); *H01L 21/223* (2013.01); *H01L 21/2633* (2013.01); *H01L 21/2636* (2013.01); *H01L 27/10823* (2013.01); *H01L 27/10885* (2013.01); *H01L 27/10888* (2013.01); *H01L 27/10891* (2013.01)

(58) Field of Classification Search
CPC ........... H01L 27/11266; H01L 27/1126; H01L 27/1122; H01L 27/108; H01L 27/10882; H01L 27/10885; H01L 27/10891; H01L 21/223; H01L 21/2236; H01L 21/26; H01L 21/263; H01L 21/2633; H01L 21/2636
See application file for complete search history.

(56) References Cited

U.S. PATENT DOCUMENTS

| | | | |
|---|---|---|---|
| 5,652,176 A | 7/1997 | Maniar et al. | |
| 5,793,075 A * | 8/1998 | Alsmeier | H01L 27/10829 257/296 |
| 6,403,412 B1 | 6/2002 | Economikos et al. | |
| 7,812,394 B2 | 10/2010 | Murthy et al. | |
| 7,977,236 B2 | 7/2011 | Nejad et al. | |

(Continued)

OTHER PUBLICATIONS

Duffy et al., "AsH3 Gas-Phase Ex Situ Doping 3D Silicon Structures" (Accepted Manuscript), Cork Open Research Archive, AIP Publishing, (2018), 34 pages.

(Continued)

*Primary Examiner* — Thanhha S Pham
(74) *Attorney, Agent, or Firm* — TraskBritt

(57) ABSTRACT

Apparatus, such as electronic devices and structures thereof, include at least one doped surface of a base (e.g., semiconductor) material. A dopant of the at least one doped surface is concentrated along the surface, defining a thickness, on or in the base material, not exceeding about one atomic layer. Methods for forming the doped surfaces involve gas-phase doping exposed surfaces of the base material in situ, within a same material-removal tool used to form at least one opening defined at least partially by the base material and into which the dopant is to be introduced.

24 Claims, 11 Drawing Sheets

(56) References Cited

U.S. PATENT DOCUMENTS

| | | |
|---|---|---|
| 8,999,825 B2 | 4/2015 | Park et al. |
| 9,219,001 B2 | 12/2015 | Wilson et al. |
| 9,543,409 B2 | 1/2017 | Arvet et al. |
| 9,773,888 B2 | 9/2017 | Pulugurtha et al. |
| 10,090,415 B1 | 10/2018 | Hekmatshoartabari et al. |
| 2004/0235282 A1 | 11/2004 | Lee et al. |
| 2008/0206972 A1 | 8/2008 | Kahen |
| 2015/0311217 A1* | 10/2015 | Chavan ............ H01L 27/10876 257/295 |
| 2016/0172235 A1 | 6/2016 | Srinivasan et al. |
| 2016/0365251 A1 | 12/2016 | Kim et al. |
| 2017/0221983 A1 | 8/2017 | Srinivasan et al. |
| 2018/0204950 A1 | 7/2018 | Cheng |

OTHER PUBLICATIONS

Duffy et al., "AsH3 Gas-Phase Ex Situ Doping 3D Silicon Structures," Journal of Applied Physics, vol. 124, (2018), 9 pages (abstract and references only).

Ransom et al., "Shallow n+ Junctions in Silicon by Arsenic Gas-Phase Doping," Journal of the Electrochemical Society, vol. 141, No. 5, (1994), pp. 1378-1381.

* cited by examiner

US 11,088,147 B2

APPARATUS WITH DOPED SURFACES, AND RELATED METHODS WITH IN SITU DOPING

TECHNICAL FIELD

The disclosure, in various embodiments, relates generally to electronic device design and fabrication. More particularly, this disclosure relates to the fabrication of apparatus (e.g., electronic devices (e.g., semiconductor devices, memory devices)) having at least one surface, which may be doped in situ in a tool otherwise configured for material-removal (e.g., etching) in conjunction with a material-removal (e.g., etching) act.

BACKGROUND

Integrated circuit designs are continually being scaled down in size in efforts to increase the number of electronic devices that can occupy a given footprint, to reduce power consumption, and to increase operational speed. With each passing generation, electronic devices tend to get smaller and more densely packed, raising a number of challenges for integration, including challenges in the methods for fabricating the small, densely-packed structures of the electronic devices. Meeting those design and fabrication challenges without sacrificing electronic device performance is a particularly difficult challenge. For example, electronic devices configured as memory devices often need to exhibit sufficient performance characteristics, such as a low refresh (e.g., the time interval at which memory cells, of the memory device, must be recharged to avoid loss of data, with refresh being a function of cell capacitance and cell junction leakage), a low write recovery time (TWR) (e.g., the time interval required between a write command to a row and precharging), and a low row hammer characteristic (e.g., a measure of a memory cell's tendency to leak charge (e.g., via junction leakage and/or gate-induced drain leakage (GIDL)) and interact electrically with a neighbor, unintentionally, which can lead to possibly changing the charge and storage of the leaking cell as well as the impacted neighboring cells of the memory device). The refresh, TWR, and row hammer characteristics may be referred to, herein, collectively as "sub-threshold characteristics."

Optimizing one performance parameter of an electronic device often detrimentally impacts another performance parameter of that device. For example, lowering dopant levels to improve refresh and reduce row hammer may tend to negatively impact TWR. Designing and fabricating electronic devices and the structures of such devices, including doped portions of the structures, in a manner that enables the electronic device (e.g., memory device) to exhibit sufficient sub-threshold characteristics (e.g., sufficient refresh, row hammer performance, and TWR) continues to present challenges.

BRIEF DESCRIPTION OF THE DRAWINGS

FIGS. 12 and 13 are cross-sectional, elevational, schematic illustrations during various stages of processing to fabricate a structure, of an electronic device, with doped surfaces formed by in situ doping in a material-removal tool, according to embodiments of the disclosure, wherein FIG. 13 is a view of the fabricated structure of the electronic device, the structure including contact comprising a conductive material within a polysilicon material.

DETAILED DESCRIPTION

Figure 1:
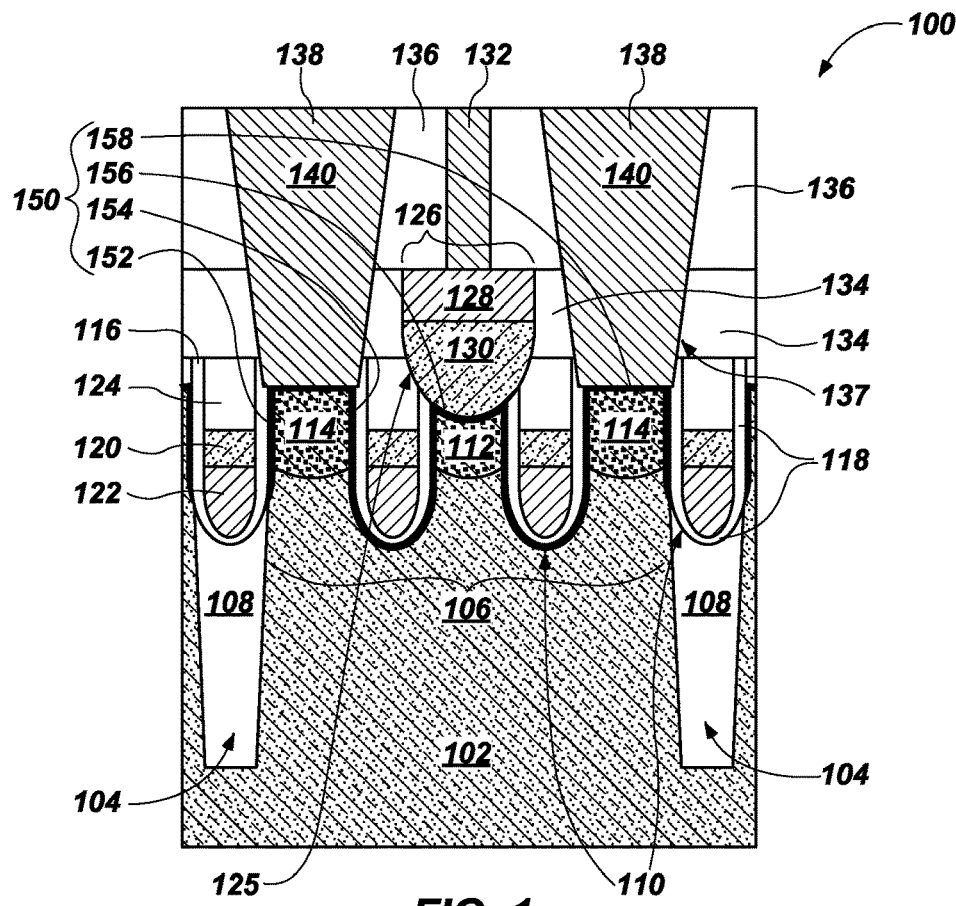
FIG. 1 is a cross-sectional, elevational, schematic illustration of a structure for an electronic device with doped surfaces, which may be formed by in situ doping in a material-removal tool, according to embodiments of the disclosure.

Apparatus (e.g., devices, systems including such devices, and structures of such devices), according to embodiments of the disclosure, include at least one doped surface, which may be formed by in situ doping in an tool otherwise configured for material removal (otherwise referred to herein as a "material-removal tool") (e.g., an etching tool (e.g., a tool for dry etching)), in conjunction with a material-removal (e.g., etching) act. Using in situ doping along with an etching act may enable a desired dopant to be uniformly formed along an entire exposed surface (e.g., a surface exposed as a result of a material-removal (e.g., etching) act) of a material with targeted composition and concentration and without significant damage to the crystal structure of the material at the surface being doped. The dopant may be concentrated along the surface itself, providing a very shallow (e.g., atomic layer or less) doped area along at least a portion of the surface of the material. The in situ doping act may result in less damage to the doped surface and in more uniformity in application along the surface than may otherwise result from conventional doping techniques, such as implantation. Further, by using the in situ doping methods of the disclosure, the dopant may be incorporated into the structure of an electronic device at a targeted surface—even a conventionally hard-to-reach surface (e.g., within openings of narrow widths and/or high aspect ratios (e.g., high height-to-width ratios (e.g., greater than about 20:1))) without significantly changing critical dimensions of the structure (e.g., without narrowing the etched opening), in contrast to conventional doping techniques, such as epitaxial growth of dopant-including material.

The apparatus of this disclosure may be electronic devices (e.g., semiconductor devices (e.g., silicon-based semiconductor devices, other semiconductor-based devices), e.g., memory devices (e.g., dynamic random access memory (DRAM) devices, flash memory (e.g., of NAND architecture) devices), or other types of electronic devices), arrays thereof, or structures thereof that include features formed by material-removal (e.g., etching) and also include doped regions within openings resulting from such material-removal acts. In some such apparatus (e.g., electronic devices (e.g., memory devices)), the doped surfaces may be formed, in situ, to be in direct contact with source/drain regions (e.g., of an access transistor), forming a structure of the electronic device with effectively no junction between source and drain regions. That is, the doped surface may be formed to extend without intervening un-doped areas that would interrupt flow of electrons along the doped surface (also referred to herein as a "continuous doped surface") directly between neighboring source and drain regions. With the continuous doped structure between a source region and a neighboring drain region, the structure may be characterized as being a "pseudo functionless" structure. With effectively no junction, the structure of the electronic device may have a minimal or no electrical field proximate the source and drain regions, which may improve the refresh exhibited by the resulting electronic (e.g., memory) device and may improve row hammer (e.g., may reduce the leakage (e.g., junction leakage, GIDL) that may otherwise be exhibited by the structure in operation). The continuous doped surface between the source and drain regions may also enable faster transport of electrons between the regions, enabling a sufficient write recovery time ("TWR") exhibited by the electronic (e.g., memory) device, even as refresh and row hammer parameters are improved. Thus, even as the dimensions of the structures of the electronic devices decrease, and as the density of structures on a given substrate footprint increase, the electronic devices including such structures may, with proper access line voltage during operation, achieve desired performance characteristics (e.g., sub-threshold characteristics (e.g., refresh rate, TWR, and row hammer)).

As used herein, the term "memory device" means and includes an electronic device incorporating, but not limited to, memory.

As used herein, the term "in situ doping" means and includes a gas-phase doping act conducted (e.g., carried out) within a tool also used, within the fabrication process flow, for a material-removal act.

As used herein, the term "access line" may be otherwise known and referred to in the art as a "word line."

As used herein, the term "digit line" may be otherwise known and referred to in the art as a "bit line" or as a "sense line."

As used herein, the terms "base material," "substrate material," and "substrate" each mean and include a supportive material or other construction upon which components, such as those within electronic devices, are formed. The base material may be a semiconductor material, a semiconductor material on another supporting structure, a metal electrode, or a semiconductor substrate having one or more materials, structures, or regions formed thereon. The base material, substrate material, or substrate may consist of, consist essentially of, or comprise a conventional silicon substrate material, another bulk substrate material, or another supportive material (e.g., a metal material). As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous fabrication stages may have been utilized to form materials, regions, or junctions on or in the base structure or foundation.

As used herein, the terms "opening" means a volume extending at least partially through or into another region or material, leaving a gap in that other region or material. Unless otherwise described, an "opening" is not necessarily empty of material. That is, an "opening" is not necessarily void space. An "opening" formed in a region or material may comprise regions or material other than that in which the opening is formed. And, a region or material "exposed" within an opening is not necessarily in contact with an atmosphere or non-solid environment. A region or material "exposed" within an opening may be in contact with or adjacent another region or material that is disposed within the opening.

As used herein, the term "trench" means and includes an elongate opening extending into or through another region or material.

As used herein, the terms "lateral" or "horizontal" mean and include a direction that is parallel to a primary surface or plane of the substrate on or in which the referenced material or structure is located. The width and length of a respective region or material may be defined as dimensions in a horizontal plane.

As used herein, the terms "longitudinal" or "vertical" mean and include a direction that is perpendicular to a primary surface or plane of the substrate on or in which a referenced material or structure is located. The height of a respective region or material may be defined as a dimension in a vertical plane.

As used herein, the terms "thickness," "thinness," "shallowness," "depth," or "height" of an identified material, region, or other feature mean and include a dimension traversing such identified material, region, or other feature in a straight-line direction that is normal to the closest surface of an immediately adjacent material or region of different composition. In the context of a "thickness," "thinness," "shallowness," "depth," or "height" of a first material on or in (e.g., incorporated on or in, added on or in, included on or in, or formed on or in) a surface of a second material, the measured dimension is the dimension that traverses the portion (of the combined structure of the first and second materials) consisting of or comprising the first material, measured in a straight-line direction normal to the closest boundary of that portion of the second material that is free of the first material.

As used herein, the term "between" is a spatially relative term used to describe the relative disposition of one material, region, or sub-region relative to at least two other materials, regions, or sub-regions. The term "between" may encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate" is a spatially relative term used to describe disposition of one material, region, or sub-region near to another material, region, or sub-region. The term "proximate" includes dispositions of indirectly adjacent, directly adjacent, and internal.

As used herein, the term "neighboring," when referring to a material or region, means and refers to a next, most proximate material or region of an identified composition or characteristic. Materials or regions of other compositions or characteristics than the identified composition or characteristic may be disposed between one material or region and its "neighboring" material or region of the identified composition or characteristic. For example, a region of a material-A "neighboring" a region of a material-B is the first material-A region, e.g., of a plurality of material-A regions, that is next most proximate to the particular region of the material-B. The "neighboring" material or region may be directly or indirectly proximate the region or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus—or to an operating condition or parameter of a referenced act—so as to facilitate a referenced property or operation of the referenced material, structure, assembly, or apparatus—or a referenced result of the referenced act—in a predetermined way.

The illustrations presented herein are not meant to be actual views of any particular structure, component, region, material, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features, or a region illustrated with curved surfaces may have wholly planar surfaces or surfaces that have a combination of curved and planar portions. Moreover, sharp angles that are illustrated may be rounded, and rounded junctions may be sharp. Thus, the materials, features, regions, and surfaces illustrated in the figures are schematic in nature, and their shapes are not intended to illustrate the precise shape of a material, feature, region, or surface and do not limit the scope of the present claims.

Any or all materials, regions, features, or surfaces illustrated in the figures as being directly adjacent one another may be in direct physical contact—without intervening materials, regions, features, or surfaces—or may be adjacent without being in direct physical contact—e.g., with one or more intervening materials, regions, features, or surfaces—unless otherwise described.

The following description provides specific details—such as material types and processing conditions—to provide a thorough description of embodiments of the disclosed devices, systems, and methods. However, a person of ordinary skill in the art will understand that the embodiments of the devices, systems, and methods may be practiced without employing these specific details. Indeed, the embodiments of the devices, systems, and methods may be practiced in conjunction with conventional electronic device (e.g., semiconductor device) fabrication techniques employed in the industry.

The fabrication processes described herein do not form a complete process flow for fabricating apparatus (e.g., electronic (e.g., semiconductor) device structures). The remainder of the process flow is known to those of ordinary skill in the art. Accordingly, only the methods and device structures necessary to understand embodiments of the present devices, structures, systems, and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

Reference will now be made to the drawings, where like numerals refer to like components throughout. The drawings are not necessarily drawn to scale.

FIG. 1 illustrates a structure 100 for an electronic device (e.g., a memory device (e.g., a DRAM memory device)). The structure 100 includes a substrate 102 (e.g., a silicon substrate, another semiconductor substrate, another substrate material, a base material) into which are formed isolation trenches 104 providing shallow trench isolation (STI) about (e.g., laterally about) active areas 106 of the substrate 102. The isolation trenches 104 may be at least partially filled with a dielectric material 108 (e.g., an oxide (e.g., silicon dioxide) ($SiO_2$)), a nitride (e.g., silicon nitride) (SiN)), an oxynitride). Access line trenches 110 (e.g., word line trenches) traverse the active area 106. At least one of, or all of, the isolation trenches 104 may include one of the access line trenches 110. For example, one of the access line trenches 110 may be formed within one of the isolation trenches 104, e.g., with the access line trench 110 at least partially recessed into the dielectric material 108. In the active area 106, a pair of the access line trenches 110 may separate a first region (e.g., source region 112) from a second region and a third region (e.g., drain regions 114), the drain regions 114 disposed to either side of the source region 112. The source region 112 and drain regions 114 may be defined by doped areas of the substrate 102 proximate an upper surface of the substrate 102. For example, the source region 112 and the drain regions 114 may be doped with an n-type dopant or with a p-type dopant.

Within each of the access line trenches 110 is a gate dielectric region 116 (e.g., comprising any one or more of the dielectric materials described herein) on sidewalls of the access line trench 110. Central to the gate dielectric region 116 is at least one conductive material providing a gate region 118. In some embodiments, the gate region 118 may include more than one material, e.g., a silicon (e.g., polysilicon) material 120 above a conductive material 122 (e.g., titanium (Ti), tungsten (W), ruthenium (Ru), cobalt (Co), an alloy of any of the foregoing, or one or more compounds or combinations thereof (e.g., TiNiW)). The remainder of the access line trenches 110 may be filled with a dielectric material 124. Thus, the structure 100 for the electronic device (e.g., the memory device (e.g., the DRAM memory device)) may include at least one access line (e.g., including the gate region 118 in the access line trenches 110) "buried" in a base material (e.g., the substrate 102) such that at least one access line (e.g., the conductive material of the gate region 118) is isolated (e.g., by the gate dielectric region 116) from the source region 112 and the drain regions 114.

A digit line trench 125, above the source region 112, is occupied by a digit line 126, which may extend perpendicular, or substantially perpendicularly, relative to the access line trenches 110, yet still extend horizontal relative to the upper surface of the active areas 106. Each digit line 126 includes at least one conductive material, such as in a conductive region 128 above a polysilicon region 130 that extends downward, past the uppermost elevation of the access line trenches 110, to the source region 112. A digit line contact 132 extends vertically to the digit line 126 (e.g., extends longitudinally relative to the height of the structure 100), to enable electrical communication with more distal components of the electronic device that includes the structure 100. Additional dielectric material (e.g., dielectric material 134 and other dielectric material 136) may neighbor the digit line 126 and the digit line contact 132.

Within contact openings 137, other contacts 138 communicate to the drain regions 114. The other contacts 138 include at least one conductive material, e.g., conductive material 140, at least partially filling the contact openings 137. In the embodiment of FIG. 1, the other contacts 138 consist of only one homogeneous region of the conductive material 140. In other embodiments, additional conductive materials or non-conductive materials may be included in the other contacts 138.

In some embodiments, at least one of the surfaces along the source region 112 and the drain regions 114 includes an active dopant (e.g., an n-type dopant (e.g., phosphorous (P), arsenic (As)), if the source region 112 and the drain regions 114 are n-type doped; or a p-type dopant (e.g., boron (B), indium (In)), if the source region 112 and the drain regions 114 are p-type doped). The dopant may have been added to the at least one surface by in situ doping in a tool otherwise configured for material removal, wherein the in situ doping is carried out in conjunction with a material-removal act by which the at least one surfaces were exposed. The one or more doped surfaces 150 may include doped surfaces along all or portions of the sidewalls of the access line trenches 110, along all or a portion of the sidewalls of the digit line trench 125, along all or a portion of the sidewalls of the contact openings 137, or any combination thereof. The doped surfaces 150 may be along the portions of the sidewalls of the trenches 110, 125, and contact openings 137 that are defined by material of the substrate 102. The "buried" access lines (e.g., the conductive material of the gate region 118) may be isolated from the doped surfaces 150 as well as from the source region 112 and the drain regions 114.

For example, in some embodiments, a doped surface 152 may extend along portions of the sidewall defining the access line trenches 110 that were formed within the isolation trenches 104, with the doped surfaces 152 being the sidewall portions defined by the material of the substrate 102. In some such embodiments, other doped surfaces (e.g., doped surfaces 154) may extend along the sidewall defining the access line trenches 110 that separate the source region 112 from the drain regions 114, again with the doped surfaces 154 being those portions of the sidewall of the access line trenches 110 that are defined by the material of the substrate 102. Each of the doped surfaces 152, 154 may be in direct physical contact with, or at least partially integrated into, one or more of the source region 112 and the drain regions 114. Doped surfaces 154 may extend directly between the source region 112 and one of its adjacent drain regions 114, providing a substantially continuous or fully continuous doped surface exhibiting a continuous conductive pathway for the travel of electrons during use and operation of the electronic device that includes the structure 100. Thus, the structure 100 of the electronic device effectively lacks a so-called "junction" between the source region 112 and the drain regions 114, eliminating an electric field that may otherwise hamper the refresh rate and write recovery time (TWR) of the electronic device that includes the structure 100.

The doped surfaces 150 may all be thin (e.g., no more than about an atomic layer of dopant) and extend substantially uniform from-the-surface depth and concentration along the respective surface area of the material of the substrate 102. Thus, the concentration of dopant along an upper-most portion of the doped surface 154 within the access line trench 110 may be about the same concentration of dopant along a lower-most portion of the doped surface 154.

Alternatively or additionally, a doped surface 156 may extend along a portion of the material of the substrate 102 that defines part of the digit line trench 125. The doped surface 156 may be a lower surface (e.g., floor) defining part of the digit line trench 125, which floor may also be an upper surface of the source region 112. In embodiments in which the doped surfaces 150 of the structure 100 also include the doped surfaces 152, 154 within the access line trenches 110, the doped surface 156 within the digit line trench 125 may be in direct physical contact with the doped surfaces 152, 154 on the sides of the source region 112. The doped surface 156 within the digit line trench 125 may, therefore, further provide a part of a continuous doped surface that promotes a continuous (e.g., uninterrupted) conduit for electron transport along the source region 112.

Alternatively or additionally, a doped surface 158 may be included along a surface portion of the material of the substrate 102 that defines at least a part of the contact openings 137. Each doped surface 158 may be a lower surface (e.g., floor) defining a lower part of contact opening 137, which floor may also be an upper surface of the drain region 114 to which the contact opening 137 communicates. In embodiments in which the doped surfaces 150 of the structure 100 also include the doped surfaces 152, 154 within the access line trenches 110, the doped surface 158 within the contact opening 137 may be in direct physical contact with the doped surfaces 152, 154 on either side of the respective drain region 114. The doped surfaces 158 within the contact openings 137 may, therefore, extend the continuous doped surface, promoting a continuous (e.g., uninterrupted) conduit for electron transport along the drain regions 114.

Each of the doped surfaces 150 (e.g., doped surfaces 152, 154, 156, 158) included in the structure 100 may include the dopant concentrated at the respective surface itself. Thus, the region of doping along the doped surfaces 150 may be shallow (e.g., thin), extending very little, if at all, into the surfaces. For example, the thickness of the concentrated dopant at or in each of the doped surfaces 150 may be no more than about an atomic layer of dopant in thickness. The shallowness (e.g., thinness) of the dopant along the doped surfaces 150 may improve the "row hammer" characteristic of the memory device, e.g., by lowering the likelihood for the electronic device including the structure 100 to experience undesirable leakage. It is contemplated that structures (e.g., the structure 100) including the doped surfaces 150 described may exhibit at least about 10% lower row hammer values (e.g., about a 15% decrease in row hammer; about a 30% decrease in row hammer) compared to such structures without the doped surfaces 150.

Figure 2:
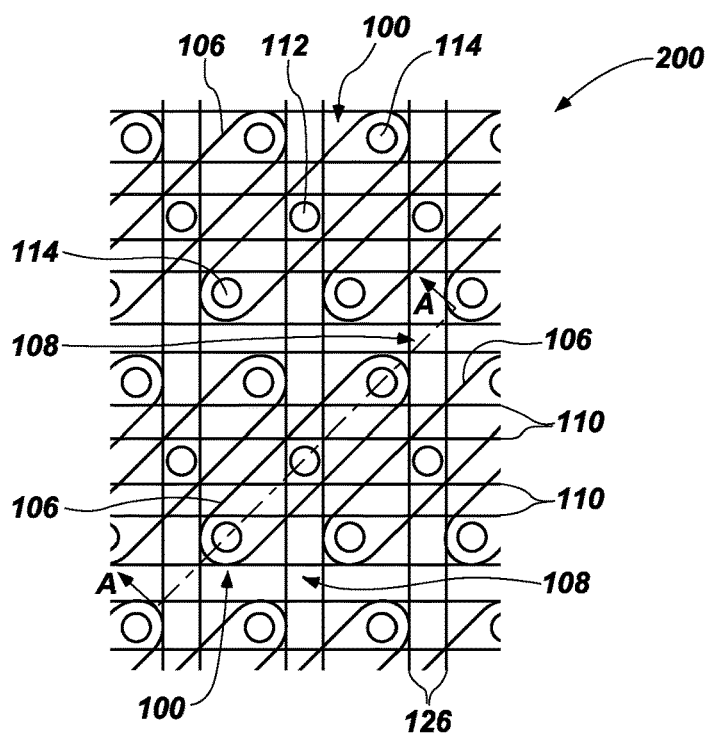
FIG. 2 is a top plan view of the structure of FIG. 1 within an array of such structures of the electronic device, wherein the view of FIG. 1 is taken along section line A-A of FIG. 2.

With reference to FIG. 2, a plurality of the structures 100 may be included in an array 200 within the electronic device. In some embodiments, the active areas 106 may be aligned at an angle (e.g., at about a forty-five degree angle) relative to the alignment of the access lines (within the access line trenches 110) and the digit lines 126.

Accordingly, disclosed is an apparatus comprising an access line, a digit line, a contact, and at least one doped surface of a base material. The access line extends into the base material and separates a first region defined in the base material from a second region defined in the base material. The digit line extends through at least one dielectric material to the first region. The contact extends through the at least one dielectric material to the second region. The at least one doped surface extends along at least a portion of one or more of the access line, the digit line, and the contact. The at least one doped surface comprises a dopant at a thickness not exceeding about one atomic layer.

FIGS. 3 through 11 illustrate various stages of a method to fabricate the structure 100 of FIG. 1 and, correspondingly, the structures 100 of the array 200 of FIG. 2. Therefore, they likewise illustrate various stages of a method to fabricate an electronic device (e.g., a memory device) that includes the structure 100 of FIG. 1 and/or the array 200 of FIG. 2.

Figure 3:
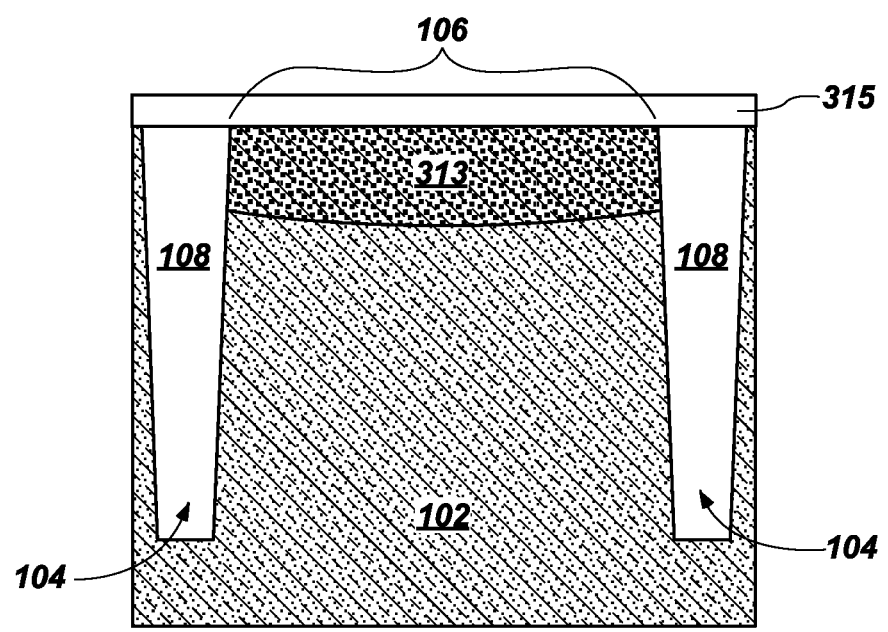
FIGS. 3 through 11 are cross-sectional, elevational, schematic illustrations during various stages of processing to fabricate the structure of FIG. 1, according to embodiments of the disclosure.

Prior to the stage of FIG. 3, a dopant (e.g., an n-type dopant, a p-type dopant) may be added (e.g., implanted) into the substrate 102 to form a doped region 313 in the active area 106. Before or after forming the doped region 313 in the material of the substrate 102, the isolation trenches 104 may be formed (e.g., etched) by removing portions of the substrate 102. The isolation trenches 104 may then be filled with the dielectric material 108 (e.g., by depositing the dielectric material 108 within the isolation trenches 104, e.g., with planarization to make an upper surface of the doped region 313 coplanar, or substantially coplanar, with an upper surface of the dielectric material 108). Another dielectric material 315 may be formed (e.g., deposited) on the doped region 313 and on the dielectric material 108 (i.e., on the isolation trenches 104). The other dielectric material 315 may be any one or more of the materials described above for the dielectric material 108. The composition of the dielectric material 108 within the isolation trenches 104 may be the same or different than the composition of the other dielectric material 315.

Figure 4:
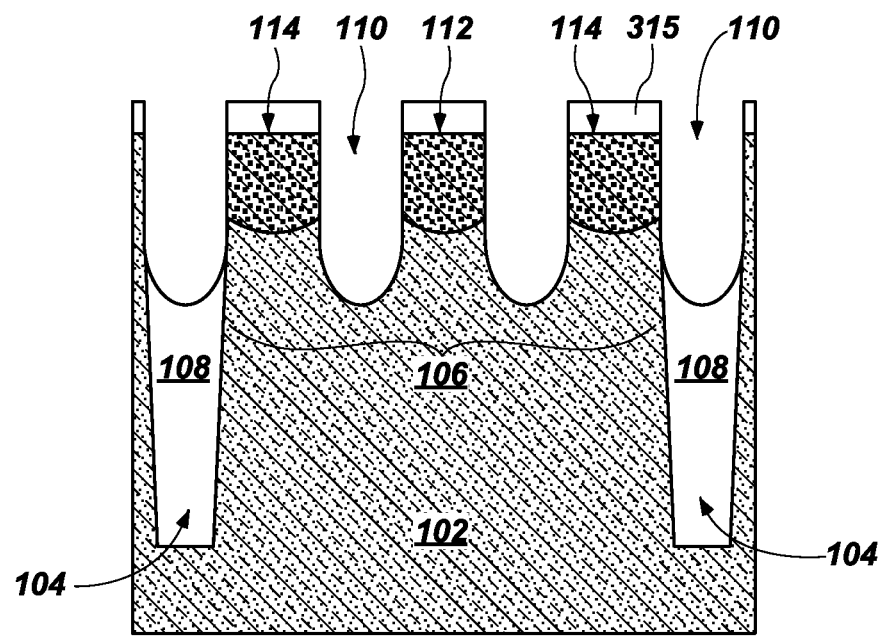

With reference to FIG. 4, the access line trenches 110 may then be formed—by a material-removal act (e.g., etching) in a material-removal tool (e.g., an etching tool) —in the dielectric material 108 of the isolation trenches 104 and in the doped region 313 (FIG. 3) of the active area 106. Forming the access line trenches 110 defines the source region 112 and the drain regions 114.

Figure 5:
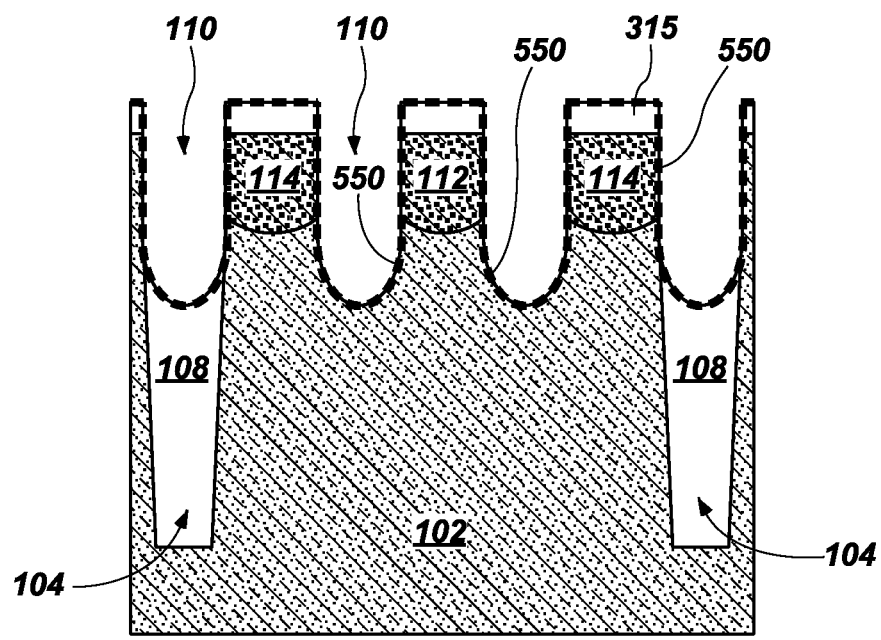

With reference to FIG. 5, a dopant 550 may be formed on all exposed surfaces by in situ doping within the same material-removal tool used for forming the access line trenches 110. In some embodiments, formation of the access line trenches 110 may be completed prior to the formation of the dopant 550 on the surfaces. In other embodiments, the dopant 550 may be incorporated on or in the surfaces while the access line trenches 110 are formed. That is, the in situ doping to add the dopant 550 to the exposed surfaces may or may not be a distinctive, separate act from the material-removal act that defines the access line trenches 110. In either case, the dopant 550 is incorporated in all exposed surfaces exposed by the formation of the access line trenches 110. Thus, the dopant 550 may be formed directly on or in sidewalls of the source region 112 and the drain regions 114.

The in situ doping (e.g., by gas-phase doping) may include exposing the structure of FIG. 4 (if the access line trenches 110 formation has already completed), the structure of FIG. 3, or intermediate structures to a precursor gas that is volatile and comprises the desired dopant element. The precursor gas may be formulated to be, itself, non-etching (e.g., non-reactive with the exposed material). For example, in embodiments in which the dopant 550 is boron, the precursor gas may be a boron-comprising gas (e.g., a volatile boron-containing gas); and, in embodiments in which the dopant 550 is arsenic, the precursor gas may be an arsenic-comprising gas (e.g., a volatile arsenic-containing gas). In embodiments in which the material-removal act (e.g., the etching) to form the access line trenches 110 is conducted concurrently with addition of the dopant 550, the structure of FIG. 3 may be exposed to both an etchant (for the material-removal act) and the precursor gas (for the gas-phase doping), concurrently, within the material-removing tool.

The particular conditions for performing gas-phase doping (e.g., flow rates, temperatures, pressures, exposure times, etc.) are generally known in the art, but may be tailored to achieve the features and performance characteristics that are desired in the in-use electronic device that includes the structure 100, e.g., to achieve incorporating the desired dopant into the exposed surfaces. For example, the composition of the precursor gas may be tailored to expose the to-be-doped materials to the particular dopant that is to be incorporated into the exposed surfaces. Likewise, temperatures and pressures may be tailored according to the compositions of the materials exposed and the gases (e.g., the etchant gases, the precursor gases) introduced into the material-removal (e.g., etching (e.g., dry etching)) tool in which the acts are conducted. The compositions and conditions may also be tailored to facilitate feature-level doping (e.g., doping of an array of features with similar, repeating feature sizes or with differing feature sizes (e.g., with critical dimensions (CDs) of, e.g., 20 nm or smaller)).

Because the material-removal act—by which the surfaces to be doped are exposed—and the dopant-addition act—by which the exposed surfaces are doped with the dopant 550—may be carried out within the same material-removal tool, whether concurrently or as a sequence of acts within the tool, the process flow for fabricating structures (e.g., the structure 100 (FIG. 1)) of the disclosure may not require significant and difficult modifications to the process flow. Furthermore, the material-removal tool may be a conventional material-removal tool (e.g., a conventional etching tool (e.g., dry etching tool) with a chamber into which one or more gases can be introduced at controlled flow rates and times, etc.). Therefore, the contemplated benefits may be enabled using readily-available equipment and without detrimental disruption to the remaining acts of the fabrication process.

Accomplishing the in situ doping by gas-phase doping enables substantially even (e.g., uniform) addition of the dopant 550 along all areas of the exposed surfaces. For example, the concentration of the dopant 550 along lower portions of the access line trenches 110 may be equal to or about equal to the concentration of the dopant 550 along higher portions of the access line trenches 110.

The in situ doping by gas-phase doping may add the dopant 550 to the exposed surfaces—e.g., of the substrate 102 material in the active area 106, of the dielectric material 108, and the other dielectric material 315—without substantially adding material mass on the surfaces. It is contemplated that the material-removal acts to form the access line trenches 110 may cause the surfaces of the access line trenches 110 to have dangling bonds or surface damage, providing bonding sites at which the atoms of the dopant 550 may bond, incorporating the dopant 550 on or in the surfaces. Therefore, a high concentration of the dopant 550 may be incorporated on or in the surfaces without growing another material region normal to the surfaces. By "high concentration of the dopant," it is contemplated that up to about an atomic layer of the dopant 550 may be included on the surfaces. In some embodiments, the "high concentration" may include, along the surfaces of at least the material of the substrate 102, the dopant 550 at a concentration of at least about $10^{16}$ dopant atoms/cm$^3$ (e.g., $10^{16}$ dopant atoms/cm$^3$ to $10^{21}$ dopant atoms/cm$^3$ (e.g., $10^{16}$ dopant atoms/cm$^3$ to $10^{18}$ dopant atoms/cm$^3$; $10^{20}$ dopant atoms/cm$^3$ to $10^{21}$ dopant atoms/cm$^3$)). Thus, the dimensions (e.g., widths, depths, lengths) of the access line trenches 110 may not be altered, at least significantly, relative to a fabrication process not including the dopant 550 addition.

In some embodiments, the dopant 550 may be incorporated (e.g., by in situ doping) into the exposed surfaces of the material of the substrate 102 at a high concentration. In contrast, the concentration of other dopant in the substrate 102 of the structure, such as outside of the doped surfaces 150 and outside of the source region 112 and the drain regions 114 (e.g., the level of doping in the lower parts of the substrate 102 and in the area between the source region 112 and a neighboring one of the drain regions 114) may be lower than the doping level in such "junctions" in conventional structures and at least lower than the high concentration of the dopant 550 along the surfaces to which the dopant 550 was added. That is, in earlier acts of the fabrication process (e.g., preceding the act illustrated in FIG. 3), the material of the substrate 102 may have been "background doped" (e.g., by a technique other than in situ doping) or otherwise formed to include a "background level" of a dopant (which may be an n-type dopant, such that the dopant 550 may be that or another n-type dopant; or a p-type dopant, such that the dopant 550 may be selected to be that or another p-type dopant). The background level of this dopant may be relatively low. For example, the "low concentration" of dopant in the material of the substrate 102 between the source region 112 and the drain region 114 (e.g., the "background dopant level") may be 0 dopant atoms/cm$^3$ to $10^{17}$ dopant atoms/cm$^3$—or, alternatively, 0 dopant atoms/cm$^3$ to $10^{16}$ dopant atoms/cm$^3$—within these relatively non-doped regions. For example, in some embodiments, the background dopant concentration may be about $10^{14}$ dopant atoms/cm$^3$ to about $10^{17}$ dopant atoms/cm$^3$ while the concentration of the dopant 550 at the surface is greater, e.g., about $10^{16}$ dopant atoms/cm$^3$ (respective to background dopant concentrations on the lower end of the aforementioned range) to about $10^{18}$ dopant atoms/cm$^3$ (respective to background dopant concentrations on the higher end of the aforementioned range). In such embodiments, in areas (e.g., surface areas) at which doped surfaces 150 adjoin one another (e.g., areas at which doped surfaces 152 and 158 meet, at which doped surfaces 158 and 154 meet, or at which doped surfaces 154 and 156 meet), the dopant 550 concentration may be about $10^{20}$ dopant atoms/cm$^3$ to about $10^{21}$ dopant atoms/cm$^3$, significantly greater than the background dopant concentration. The lesser concentration of doping in the bulk of the material of the substrate 102—including in portions of the substrate 102 outside, but between, the source region 112 and the drain regions 114—relative to conventional structures, may improve the refresh of the electronic device that includes the structure 100, or the array 200 of the structures 100, without significantly increasing TWR performance.

Moreover, the in situ doping act, using gas-phase doping, is contemplated to cause less damage to the exposed surfaces than compared to such conventional doping techniques as implantation. The lesser amount of damage is contemplated to improve the refresh and TWR properties of the resulting electronic device that includes the structure 100, or the array 200 of the structure 100, as compared to such electronic devices formed using only conventional doping techniques such as implantation.

After forming the dopant 550, the dopant 550 is activated (e.g., by heat) to form the doped surfaces 152, 154 (FIG. 1). Such activation may be by exposing the structure of FIG. 5 to heat as an immediately-next or otherwise subsequent fabrication act following that of FIG. 5. In some embodiments, the activation of the dopant 550 may result from subsequent material-formation acts involving heat, such as during formation of the gate dielectric region 116. For example, the gate dielectric region 116 may be formed by depositing or growing the dielectric material of the gate dielectric region 116 directly on the dopant 550, which may expose the dopant 550 to heat, causing the dopant 550 to activate along certain portions of the dopant-including surface. Techniques for forming such gate dielectric regions 116 are known in the art and so are not reiterated here. Thus, aside from forming the gate dielectric regions 116 directly on the dopant 550, the formation techniques may be conventional. And, conventional formation techniques typically involve use of temperatures high enough to activate the dopant 550 where it is incorporated within the material of the substrate 102.

Figure 6:
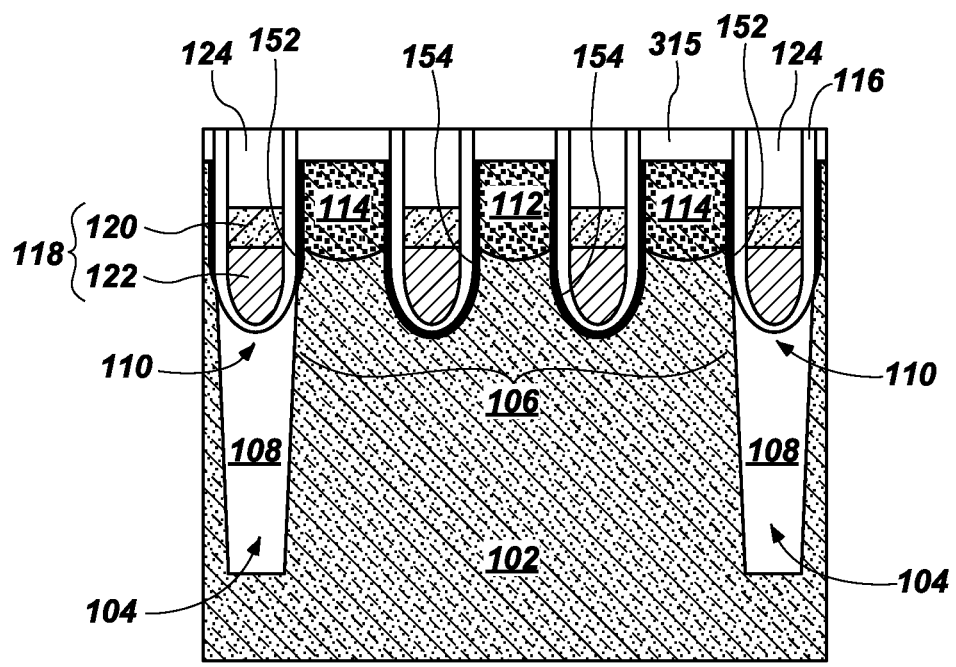

Due to the nature of the dopant 550 and the materials into which it was incorporated by the in situ doping act, the dopant 550 may activate only along those portions of the surfaces of the access line trenches 110 that exposed material of the substrate 102 (e.g., silicon material). The dopant 550 may not become activated where incorporated in dielectric material (e.g., the dielectric material 108 within the isolation trenches 104) or in the other dielectric material 315 along the upper surface of the structure. The activated areas of the dopant 550 provide the doped surfaces 152, 154, as illustrated in FIG. 6.

Accordingly, in some embodiments, the doped surfaces 152—within the access line trenches 110 formed in the isolation trenches—may extend along substantially vertical sidewall portions, directly on sidewalls of the drain regions 114, but not along a bottom of the access line trenches 110, e.g., where the dielectric material 108 is exposed. And, within the access line trenches 110 separating the source region 112 from its neighboring drain regions 114, the doped surface 154 may extend as a continuous doped surface directly between a sidewall of the source region 112 and a neighboring sidewall of the drain region 114 adjacent the source region 112.

Subsequent to forming the gate dielectric region 116, the gate region 118 may be formed (e.g., by depositing or growing the at least one conductive material of the gate region 118, e.g., by depositing or growing the conductive material 122 and then the polysilicon material 120 within the gate dielectric region 116). Dielectric material 124 may then be formed over the gate region 118 to fill the remaining volume of the access line trenches 110. Planarization may be used to make the upper surface of the dielectric material 124 coplanar, or substantially coplanar, with the upper surface of the dielectric material 315 on the source and drain regions 112, 114. In other embodiments (not shown), planarization may be used to remove the dielectric material 315 (and any non-activated amounts of the dopant 550 therein) over the source and drain regions 112, 114 and the upper portions of the dielectric material 124 within the access line trenches 110 to make the upper surfaces of the source and drain regions 112, 114 coplanar, or substantially coplanar, with upper surfaces of the dielectric material 124 topping the access line trenches 110.

Figure 7:
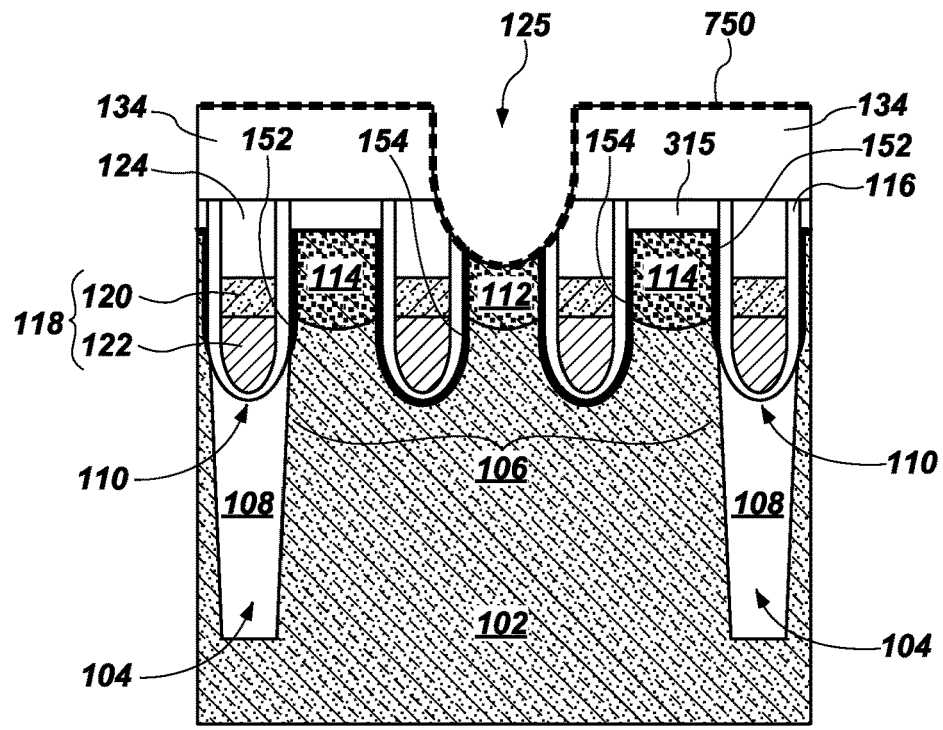

With reference to FIG. 7, the dielectric material 134 may be formed (e.g., deposited) over the source region 112 and the drain regions 114, e.g., on the dielectric material 124 topping the access line trenches 110 and on the other dielectric material 315, if still present above the source and drain regions 112, 114. The digit line trench 125 may be formed (e.g., etched) to extend through the dielectric material 134 and further downward to expose an upper surface of the source region 112. Forming the digit line trench 125 may, therefore, remove the region of the other dielectric material 315 (and any non-activated amount of the dopant 550 that was incorporated therein) that was previously above the source region 112.

Dopant 750 may be incorporated on or in all exposed surfaces—by in situ doping in the same material-removal tool used to form the digit line trench 125—including all exposed surfaces defining the digit line trench 125. So, the dopant 750 may be incorporated directly on or in a surface of the source region 112. The in situ doping may be carried out concurrently with the material-removal to form the digit line trench 125 or as a subsequent act. Thus, this in situ doping to add the dopant 750 may entail the same acts used for the aforementioned in situ doping to add the dopant 550, with the exception that the surfaces exposed during the acts are the surfaces of the dielectric material 134 and the surfaces defining the digit line trench 125.

The dopant 750 may comprise, consist essentially of, or consist of any one or more of the dopants previously described (e.g., the dopant 550 (FIG. 5)). The composition, concentration, and from-surface-depth of the dopant 750 incorporated on or in the surfaces of the digit line trench 125 may be the same or different than the composition, concentration, and from-surface-depth of the dopant 550 incorporated on or in the surfaces exposed in the access line trenches 110.

Figure 8:
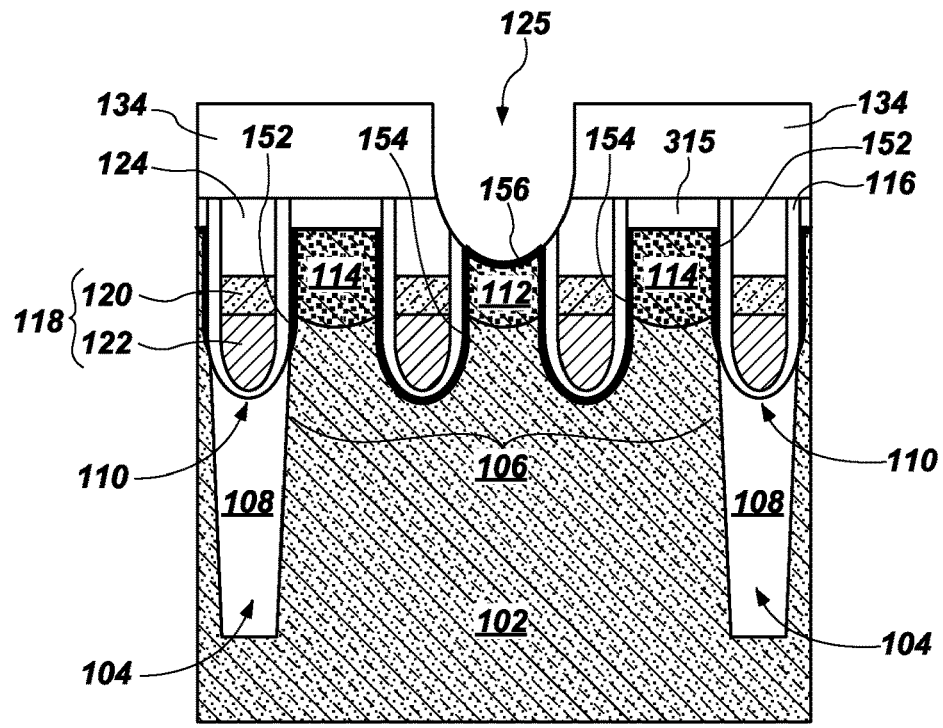

With reference to FIG. 8, the dopant 750 may then be activated (e.g., by exposure to heat) to form the doped surface 156 directly on the source region 112 at the base of the digit line trench 125, e.g., along the portion of the digit line trench 125 that is defined by an exposed surface of material of the substrate 102. As with the dopant 550 of FIG. 5, the dopant 750 of FIG. 7 may activate only where incorporated on or in substrate 102 material. The doped surface 156 may extend, as a continuous doped surface, directly between the doped surfaces 154 formed along the sidewalls of the source region 112.

Using the in situ doping acts described, the doped surface 156 may exhibit a substantially uniform dopant concentration along its surface area, with less surface damage than may have been exhibited by conventional doping techniques (e.g., implantation), and with a shallow distribution area (e.g., about an atomic layer thickness or less).

Figure 9:
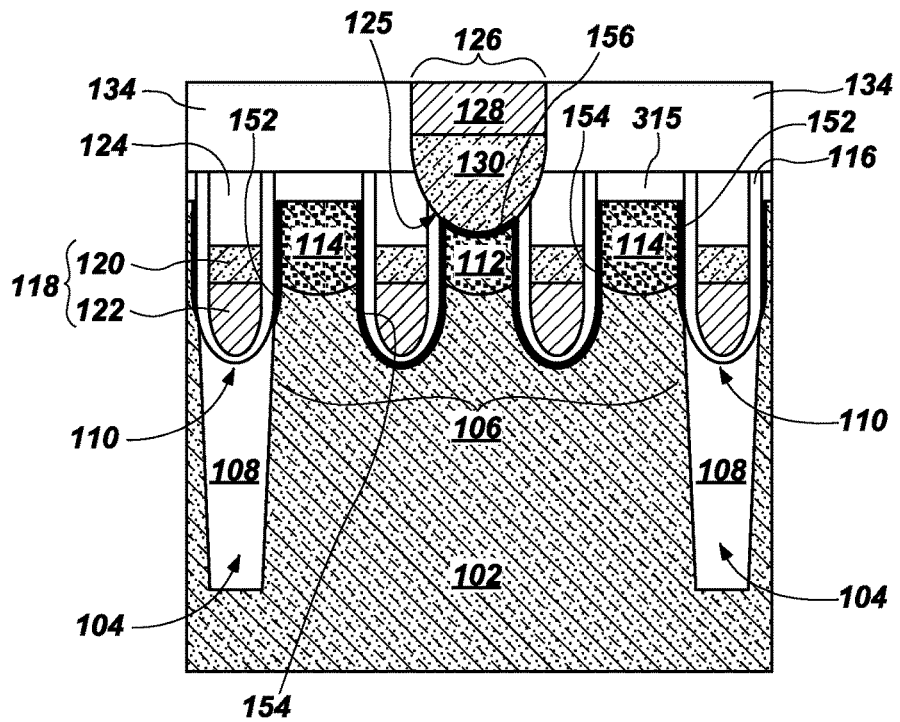

With reference to FIG. 9, the materials of the digit line 126 may be formed in the digit line trench 125. For example, polysilicon material may be formed (e.g., deposited, grown) in the base of the digit line trench 125 to form the polysilicon region 130, and conductive material (e.g., any one or more of the conductive materials previously discussed) may be formed (e.g., deposited) in the upper volume of the digit line trench 125 to form the conductive region 128. Planarization may be used to make an upper surface of the conductive region 128 coplanar, or substantially coplanar, with an upper surface of the dielectric material 134.

In some embodiments, forming the materials of the digit line 126 may not be preceded by a separate act to activate the dopant 750 (FIG. 7). Instead, the act of forming the materials of the digit line 126 (e.g., the polysilicon region 130) in the digit line trench 125, e.g., directly on the dopant 750, may expose the dopant 750 to sufficient heat to activate the dopant 750 where it is incorporated within the material of the substrate 102 (e.g., along the upper surface of the source region 112).

Figure 10:
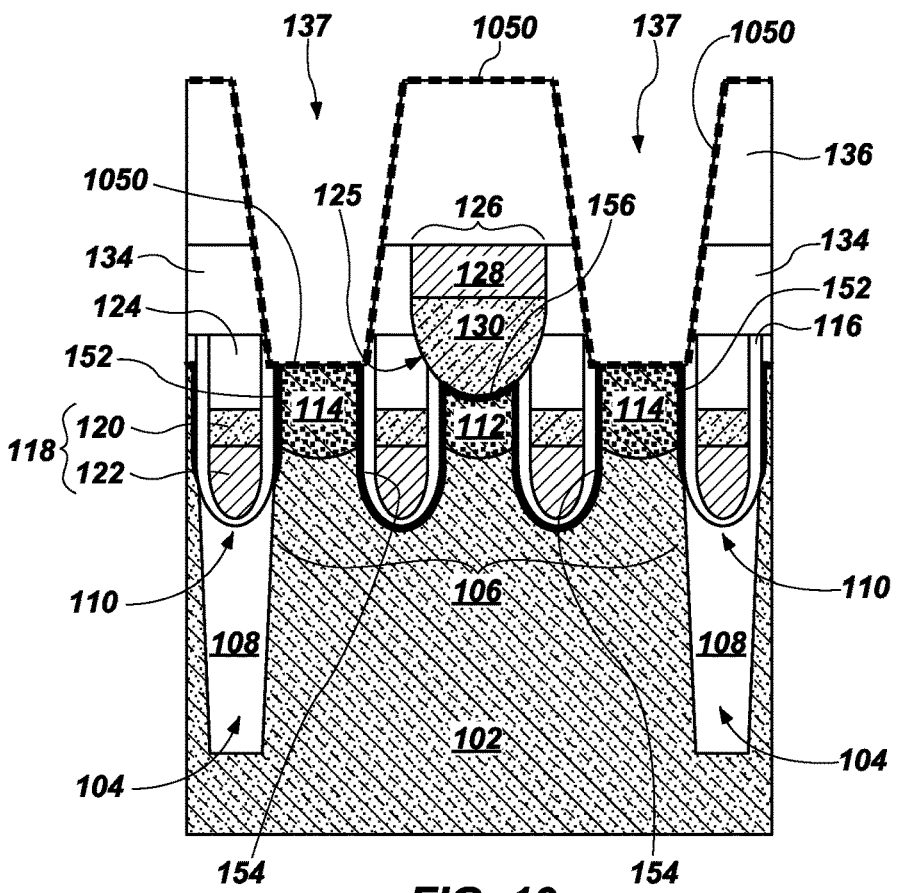

With reference to FIG. 10, the other dielectric material 136 (e.g., any one or more of the aforementioned dielectric materials) may be formed (e.g., deposited) over the dielectric material 134 and the digit line 126, and then the contact openings 137 may be formed (e.g., etched) into the other dielectric material 136, through the dielectric material 134, to expose a surface of the drain regions 114.

By in situ doping within the same material-removal tool used to form the contact openings 137, dopant 1050 may be incorporated on or in all exposed surfaces, including on or in all exposed surfaces defining the contact openings 137. Thus, the dopant 1050 may be added directly on or in an upper surface of the drain regions 114. The in situ doping acts may be the same as that described above with regard to adding the dopant 550 (FIG. 5) on or in the surfaces exposed in the access line trenches 110 or with regard to adding the dopant 750 (FIG. 7) on or in the surfaces exposed in the digit line trench 125. For example, adding the dopant 1050 may be carried out concurrently with, or as a subsequent act to, forming the contact openings 137 within the material-removal tool. The dopant 1050 within the contact openings 137 may have the same or different concentration, composition, and depth as the dopant 550 for the access line trenches 110 or the dopant 750 for the digit line trench 125.

Figure 11:
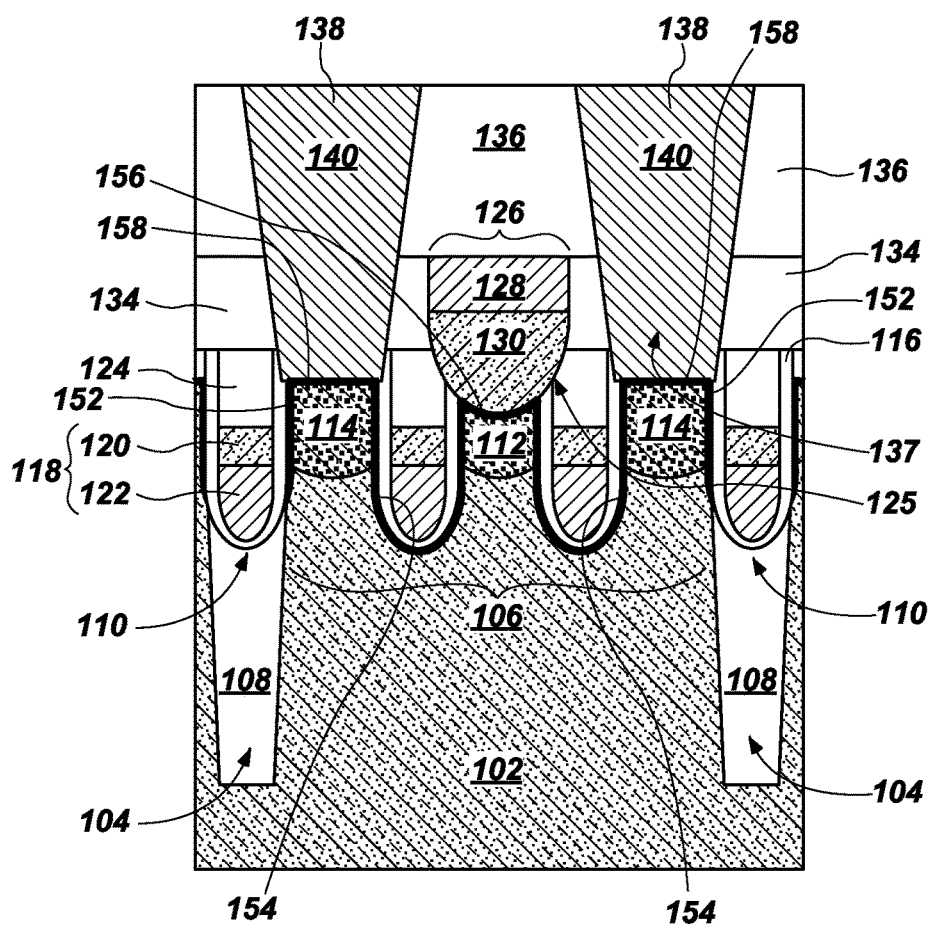

The dopant 1050 may thereafter be activated (e.g., exposed to heat) to form the doped surface 158—as illustrated in FIG. 11—at the base of the contact openings, directly on the drain regions 114. The dopant 1050 (FIG. 10) may activate only where incorporated on or in the material of the substrate 102, in that the dopant 1050 may be formulated not to activate where on or in dielectric material (e.g., the material of the gate dielectric region 116, dielectric materials 124, 134, or the other dielectric material 136). The doped surface 158 may extend, as a continuous doped surface, directly between the doped surfaces 152, 154 on the sidewalls of the drain regions 114.

Using the in situ doping acts described, the doped surface 158 may exhibit a substantially uniform concentration along its surface area, with less surface damage than may have resulted from a conventional doping techniques (e.g., implantation), and with a shallow distribution region (e.g., about an atomic layer thickness or less).

The in situ doping acts for forming the doped surfaces 158 in the contact openings 137 targets addition of the dopant 1050 (FIG. 10) at a desired concentration. That is, the in situ doping (e.g., by gas-phase doping) incorporates the dopant 1050 substantially consistently along all surfaces exposed to the precursor gas of the gas-phase doping act. This even distribution of dopant is in contrast, e.g., to conventional doping techniques like implantation that may exhibit scattering of a dopant in a manner that does not distribute the dopant consistently. The in situ doping acts enable adding a consistent, desired amount (e.g., concentration) of the dopant 1050 directly to each of the upper surface of the drain regions 114 exposed to the in situ doping act.

One or more conductive materials (e.g., the conductive material 140) may be formed (e.g., deposited) within the contact openings 137, and on the doped surfaces 158, to form the other contacts 138 that communicate with the drain regions 114. In some embodiments, forming the contacts 138 may be preceded by subjected (e.g., exposing) the dopant 1050 (FIG. 10) to heat to activate the dopant 1050 and form the doped surfaces 158. In other embodiments, forming the other contacts 138 (e.g., forming the conductive material 140) within the contact openings 137 may, itself, subject the dopant 1050 to sufficient heat to activate the dopant 1050 and form the doped surfaces 158.

Thereafter, the digit line contact 132 (FIG. 1) may be formed (e.g., by removing (e.g., etching) a portion of the other dielectric material 136 to form an opening communicating with the conductive region 128 of the digit line 126, and by filling such opening with the conductive material of the digit line contact) to form the structure 100 of FIG. 1.

Because the doped surfaces 158 are formed by the in situ doping acts, itself, filling the contact openings 137 to form the other contacts 138 may immediately follow adding the dopant 1050 (FIG. 10) to the surfaces defining the contact openings 137. That is, methods of the disclosure may avoid conventional practices of adding a heavily-doped carrier material (e.g., a heavily-doped polysilicon) within openings such as the contact openings 137 and then exposing the heavily-doped carrier material to a thermal act to drive dopant from the heavily-doped carrier material into surrounding surfaces along the contact openings 137 to transfer dopant from the carrier material into the surrounding surfaces to dope those surfaces. Such conventional carrier material—once depleted of all or some of its initial dopant—may be removed leaving openings that may then be filled with conductive material. By embodiments of the method involving the stage illustrated in FIG. 11, conventional acts of formation and removal of a highly-doped carrier material and intermediate thermal drive may be avoided. Thus, embodiments of the methods of the disclosure may be used to form the structure 100 by a simplified process, which may require a lower amount of dopant to be used because its addition is targeted to the exposed surfaces.

Figure 12:
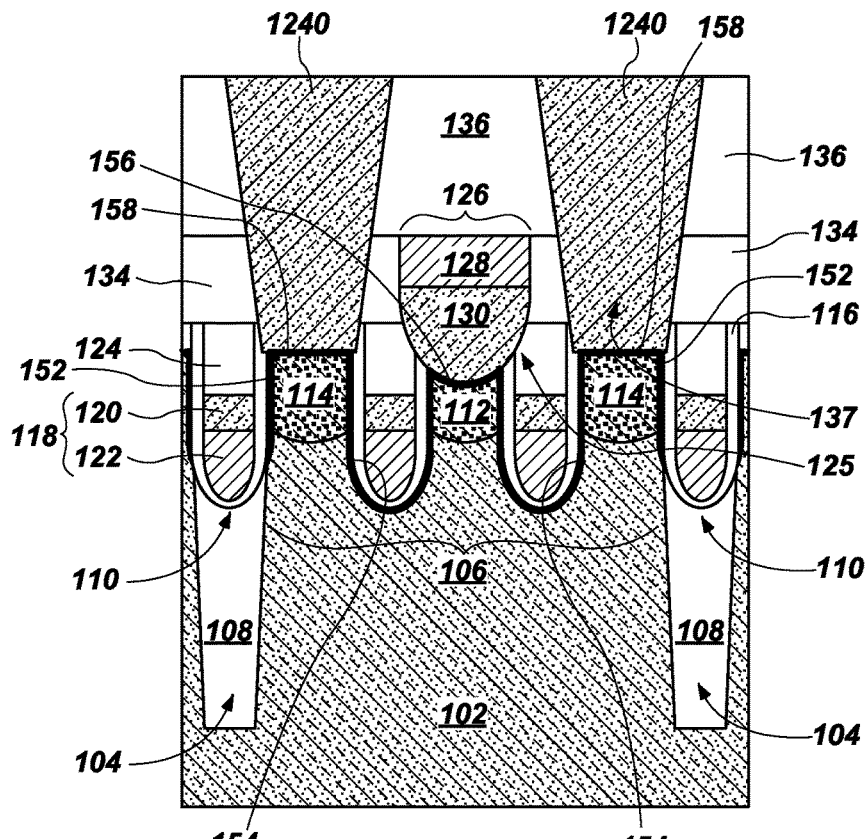

In other embodiments of the disclosure, the in situ doping act forming the structure of FIG. 10 may be followed by dopant-carrier formation, thermal drive, and carrier-removal acts or other material formation, material-removal, and additional material formation to fill the contact openings 137. For example, as illustrated in FIG. 12—which act may follow that illustrated in FIG. 10—a polysilicon material 1240 may be formed (e.g., deposited, grown) to fill the contact openings 137, covering the doped surfaces 158 at the base of the contact openings 137. Forming the polysilicon material 1240 may expose the dopant 1050 (FIG. 10) to the heat to activate the dopant 1050 to form the doped surfaces 158 on the drain regions 114. A laterally central portion of the polysilicon material 1240 may be removed (e.g., by etching) to expose at least a portion of the doped surfaces 158 at the upper surface of the drain regions 114, and then the conductive material 140 formed (e.g., deposited) therein to fill the contact openings 137 and form other contacts 1338 that communicate to the drain regions 114.

Forming the digit line contact 132 may follow completion of forming the other contacts 1338. Alternatively, the digit line contact 132 may be formed concurrently with, e.g., forming the conductive material 140. Either way, structure 1300 is formed and includes at least one doped surface 150 (e.g., the doped surfaces 152, 154, 156, 158).

Accordingly, disclosed is a method of forming an apparatus. The method comprises—within a material-removing tool—removing at least one portion of a base material to define at least one opening in the base material. Also within the material-removing tool, exposed surfaces of the base material—which exposed surfaces define the at least one opening—are doped with a dopant to incorporate the dopant on or into the base material to a thickness not exceeding about one atomic layer.

Figure 13:
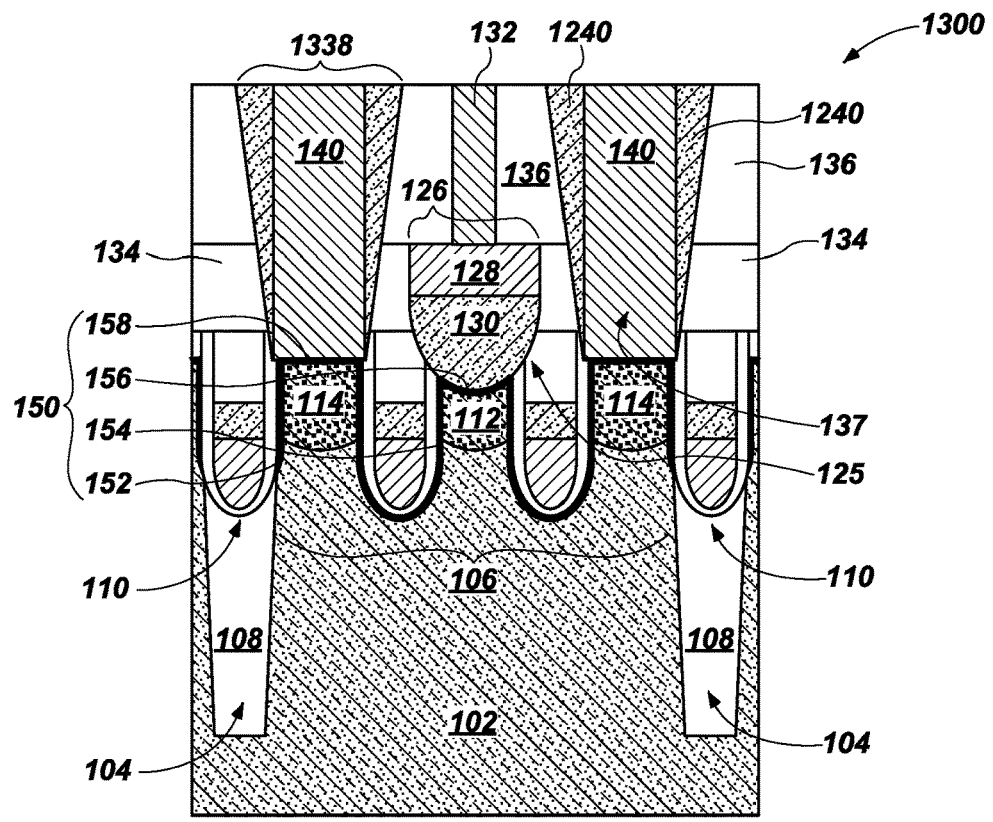

The structures 100 and 1300 of FIGS. 1 and 13, respectively, include doped surfaces 150 formed by in situ doping in each of the access line trenches 110 (e.g., doped surfaces 152, 154), the digit line trench 125 (e.g., doped surface 156), and the contact openings 137 (e.g., doped surfaces 158). In other embodiments, one or more of these doped surfaces 150 formed by in situ doping acts may be omitted, or additional such in situ doping acts may be performed (e.g., in conjunction with other material-removal acts) to tailor the structures to the needs of the electronic device being formed.

Figure 14:
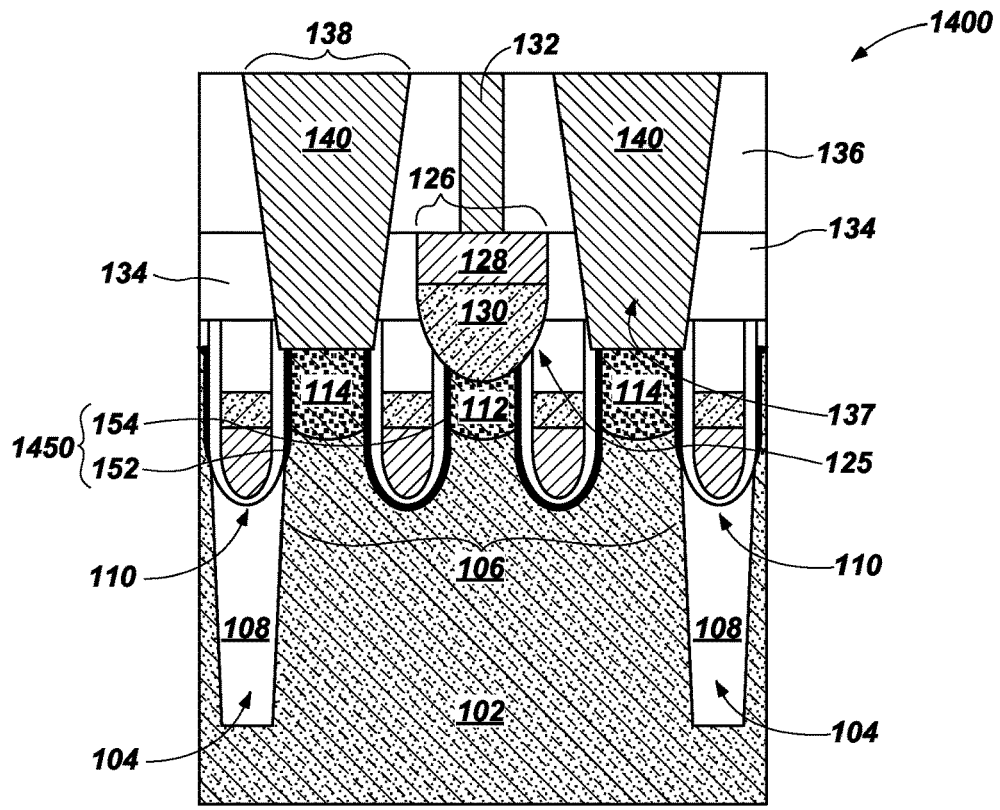
FIG. 14 is a cross-sectional, elevational, schematic illustration of a structure for an electronic device with doped surfaces—which may be formed by in situ doping in a material-removal tool—along portions of access line trenches, according to embodiments of the disclosure.

For example, with reference to FIG. 14, illustrated is a structure 1400 including at least one doped surface 1450, namely, the doped surfaces 152, 154 formed by carrying out the aforementioned in situ doping acts for the access line trenches 110 only. The digit line trench 125 and the contact openings 137 may not have been subjected to in situ doping—e.g., in embodiments in which the structure 1400 is not in need of additional doping along the upper surfaces of the source region 112 and the drain regions 114. The structure 1400, therefore, includes the doped surfaces 152, 154 extending along sidewalls of each of the source and drain regions 112, 114, as well as along the base of the access line trenches 110 that separate the source region 112 from the drain regions 114. The electronic device (e.g., memory device) with the structure 1400—or with an array (e.g., array 200 (FIG. 2)) of the structures 1400—may nonetheless exhibit improved refresh, TWR, and/or row hammer at least because the direct contact between the doped surfaces 152, 154 and the source and drain regions 112, 114 exhibit essentially no junction proximate the source and drain regions 112, 114. Therefore, the structure 1400 may be characterized as a structure of a pseudo functionless electronic device (e.g., memory device), like structures 100 (FIG. 1) and 1300 (FIG. 13).

Figure 15:
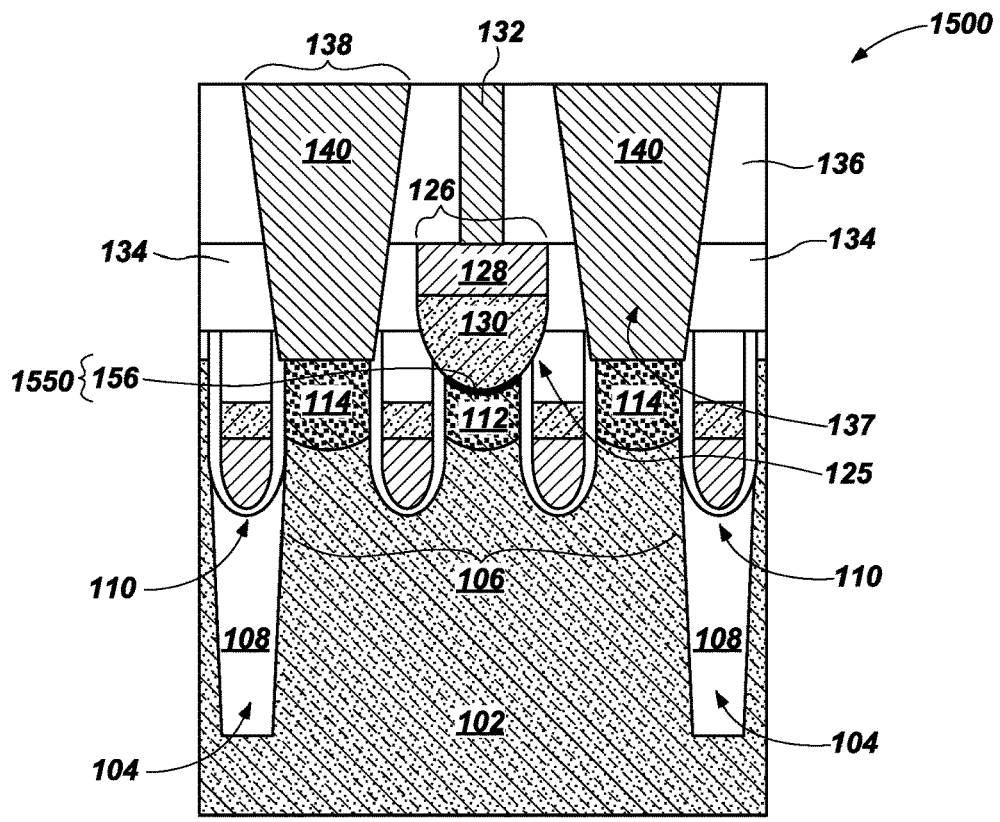
FIG. 15 is a cross-sectional, elevational, schematic illustration of a structure for an electronic device with a doped surface—which may be formed by in situ doping in a material-removal tool—along an upper portion of a source region, according to embodiments of the disclosure.

As another example, with reference to FIG. 15, illustrated is a structure 1500 including at least one doped surface 1550, namely, the doped surface 156 at the upper surface of the source region 112. In such embodiment, the access line trenches 110 and the contact openings 137 may not have been subjected to in situ doping—e.g., in embodiments in which the structure 1500 is not in need of additional doping along the drain regions 114.

Figure 16:
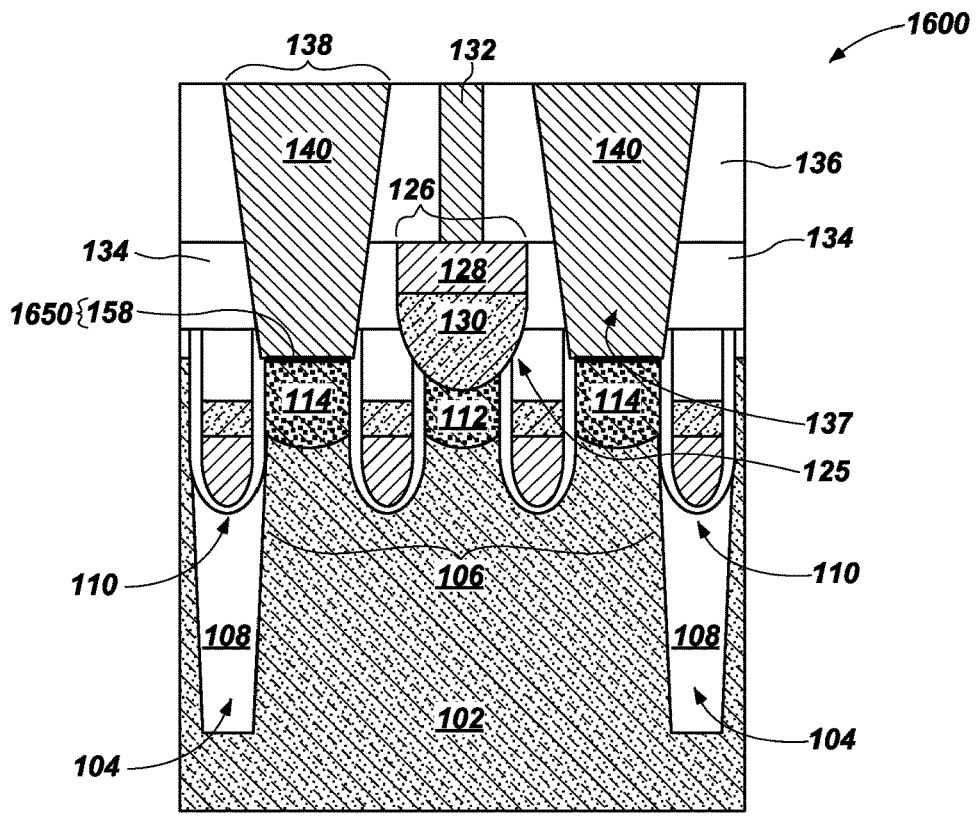
FIG. 16 is a cross-sectional, elevational, schematic illustration of a structure for an electronic device with doped surfaces—which may be formed by in situ doping in a material-removal tool—along an upper portion of drain regions, according to embodiments of the disclosure.

FIG. 16 illustrates a structure 1600 including at least one doped surface 1650, namely, the doped surfaces 158 of the contact openings 137. Thus, the structure 1600 includes the doped surfaces 158—formed by the in situ doping acts—directly on the drain region 114 upper surfaces only.

Figure 17:
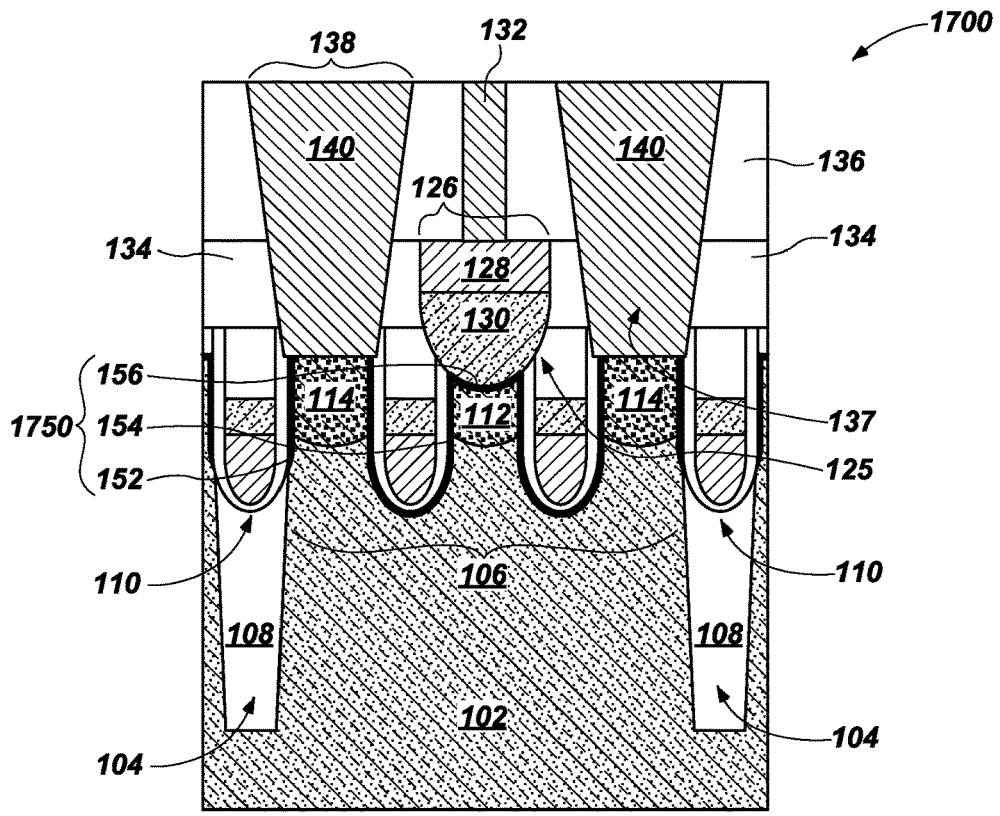
FIG. 17 is a cross-sectional, elevational, schematic illustration of a structure for an electronic device with doped surfaces—which may be formed by in situ doping in a material-removal tool—along portions of access line trenches as well as along an upper portion of a source region, according to embodiments of the disclosure.

FIG. 17 illustrates a structure 1700 including at least one doped surface 1750, namely, the doped surfaces 152, 154 of the access line trenches 110 and the doped surface 156 of the digit line trench 125. As such, the structure 1700 does not include in situ doped surfaces at the upper surface of the drain regions 114.

Figure 18:
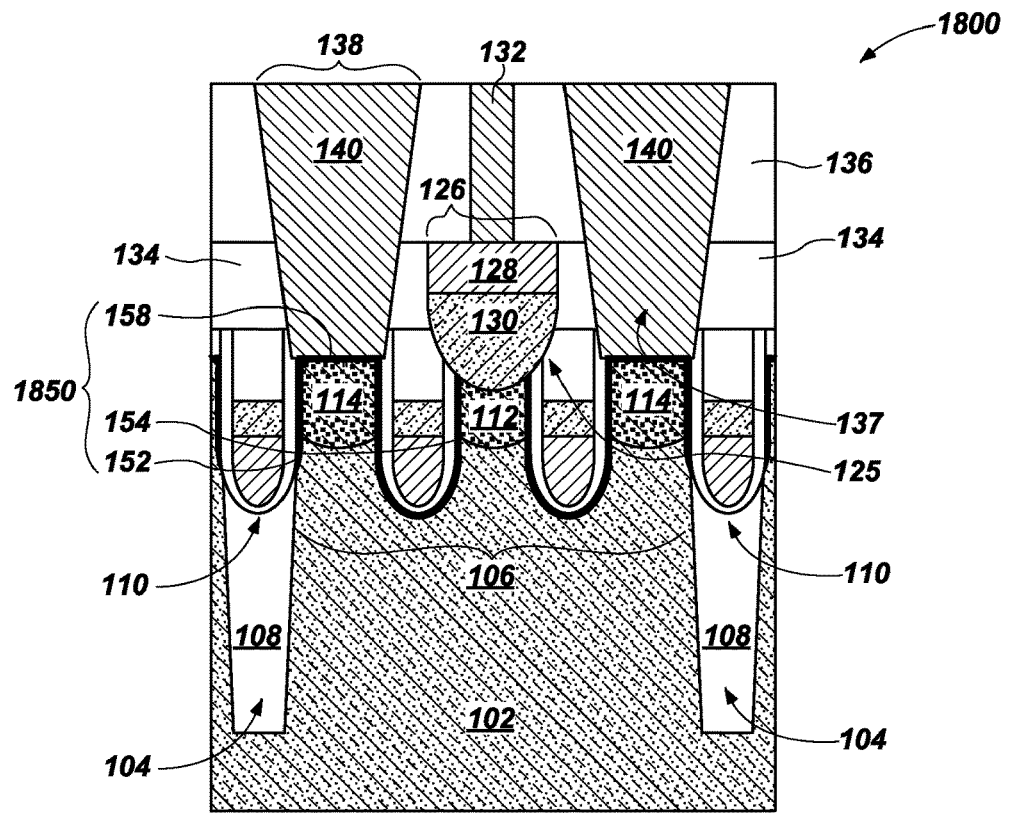
FIG. 18 is a cross-sectional, elevational, schematic illustration of a structure for an electronic device with doped surfaces—which may be formed by in situ doping in a material-removal tool—along portions of access line trenches as well as along an upper portion of drain regions, according to embodiments of the disclosure.

FIG. 18 illustrates a structure 1800 including at least one doped surface 1850, namely, the doped surfaces 152, 154 of the access line trenches 110 and the doped surface 158 of the contact openings 137.

Figure 19:
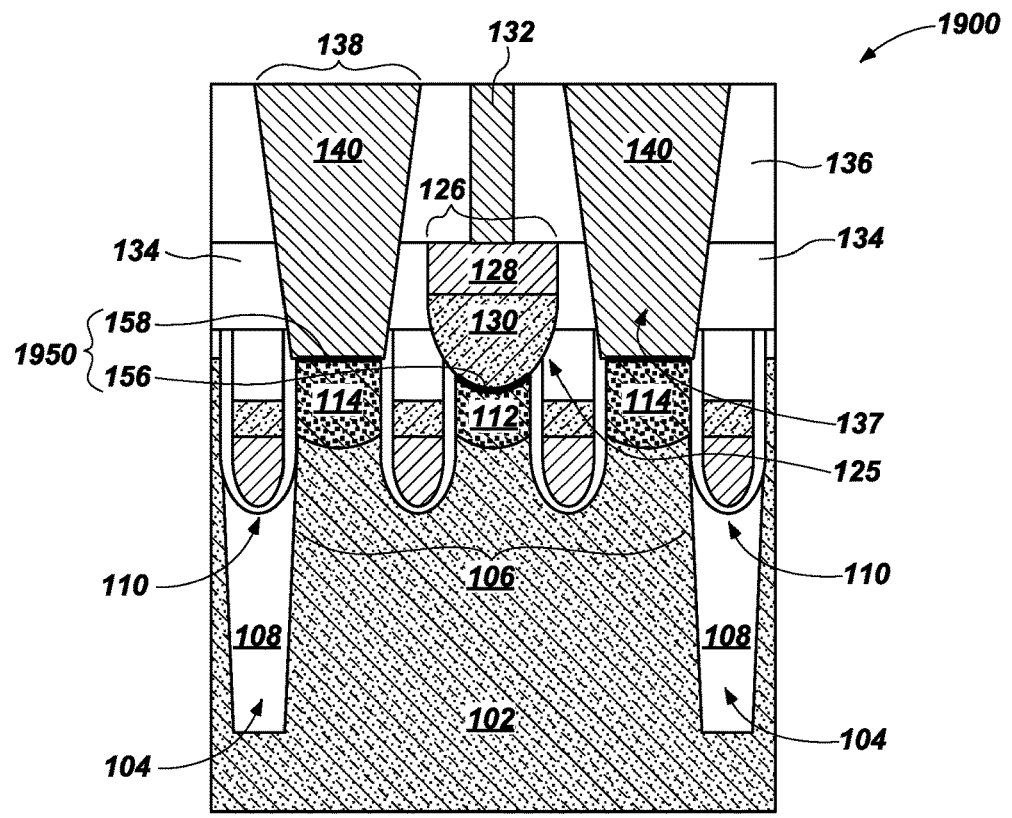
FIG. 19 is a cross-sectional, elevational, schematic illustration of a structure for an electronic device with doped surfaces—which may be formed by in situ doping in a material-removal tool—along an upper portion of a source region as well as along an upper portion of drain regions, according to embodiments of the disclosure.

FIG. 19 illustrates a structure 1900 including at least one doped surface 1950, namely, the doped surfaces 156 of the digit line trench 125 and the doped surfaces 158 of the contact openings 137. In the structure 1900 only the upper surfaces of each of the source region 112 and the drain regions 114 include the dopant added by in situ doping.

Accordingly, disclosed is a method of doping surfaces of a structure for an apparatus. The method comprises introducing, to a dry etching tool, a structure comprising a base material. Within the dry etching tool, an etchant gas is introduced to remove at least one portion of the base material to define therein at least one opening. Also within the dry etching tool, a precursor gas—comprising a dopant—is introduced to incorporate the dopant into exposed surfaces of the base material. The method also comprises exposing the dopant to heat to form a doped surface along the exposed surfaces of the base material. The dopant extends into the base material at a depth not exceeding about one atomic layer.

Figure 20:
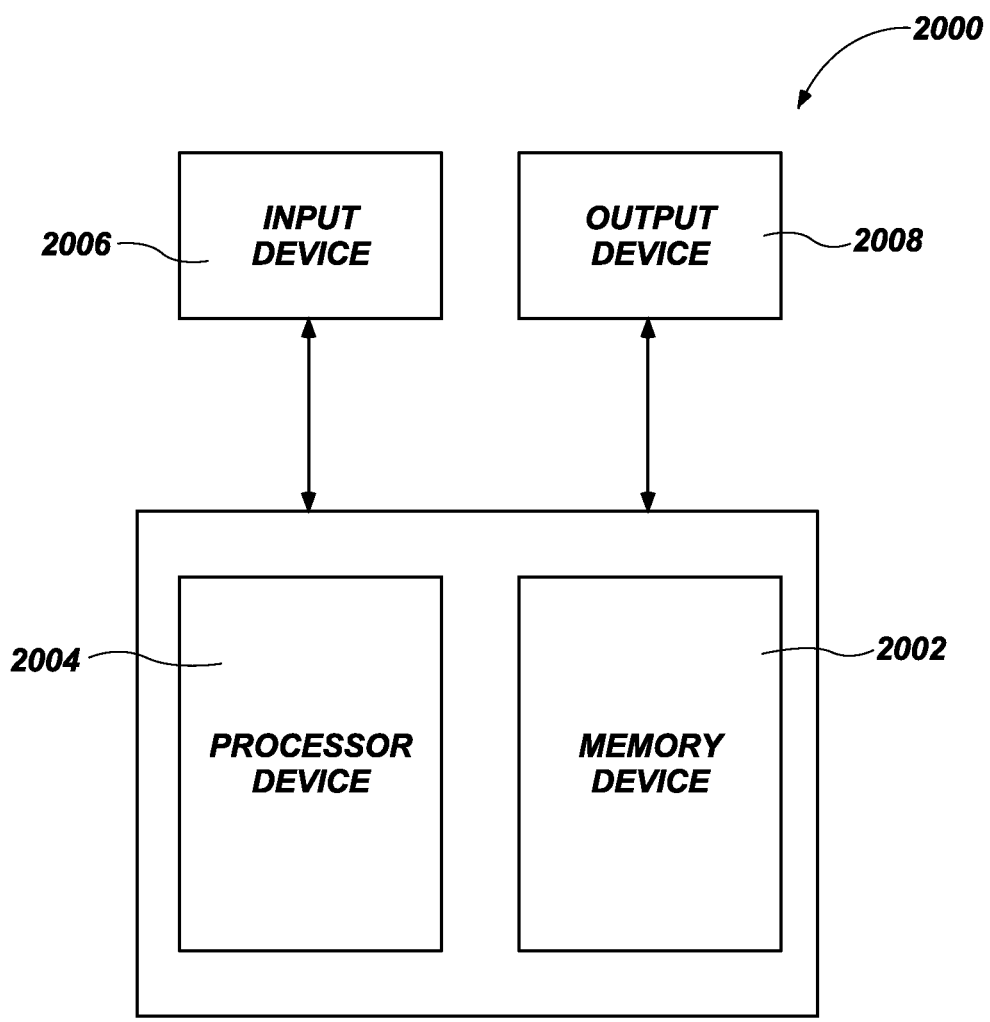
FIG. 20 is a schematic block diagram illustrating an electronic system in accordance with embodiments of the disclosure.

Electronic devices (e.g., semiconductor devices, memory devices (e.g., DRAM devices)) that include structures 100 (FIG. 1), 1300 (FIG. 13), 1400 (FIG. 14), 1500 (FIG. 15), 1600 (FIG. 16), 1700 (FIG. 17), 1800 (FIG. 18), or 1900 (FIG. 19) or arrays of any thereof (e.g., in the array 200 of FIG. 2), in accordance with embodiments of the disclosure, may be used in embodiments of electronic systems of the disclosure. For example, FIG. 20 is a block diagram of an illustrative electronic system 2000 according to embodiments of the disclosure. The electronic system 2000 may comprise, e.g., a computer or computer hardware component, a server or other networking hardware component, a cellular telephone, a digital camera, a personal digital assistant (PDA), portable medial (e.g., music) player, etc. The electronic system 2000 includes at least one memory device 2002. The electronic system 2000 may further include at least one electronic signal processor devices 2004 (which may otherwise be referred to in the art as a "microprocessor"). At least one of the electronic signal processor device 2004 and the at least one memory device 2002 may include, e.g., an embodiment of the structures 100 (FIG. 1), 1300 (FIG. 13), 1400 (FIG. 14), 1500 (FIG. 15), 1600 (FIG. 16), 1700 (FIG. 17), 1800 (FIG. 18), or 1900 (FIG. 19) or arrays of any thereof (e.g., in the array 200 of FIG. 2). The at least one memory device 2002 and the at least one electronic signal processor device 2004 may be combined on a "system on a chip (SoC)." Therefore, at least one of the electronic signal processor device 2004 and the at least one memory device 2002 may include an embodiment of the doped surfaces 152, 154, 156, and/or 158—formed by in situ doping in a tool otherwise configured for material removal and in conjunction with a material-removal act.

The electronic system 2000 may further include one or more input devices 2006 for inputting information into the electronic system 2000 by a user, e.g., a pointing device (e.g., a mouse), a keyboard, a touchpad, a button, a control panel, or combinations thereof. The electronic system 2000 may further include one or more output devices 2008 for outputting information (e.g., visual output, audio output) to a user, e.g., a monitor, a display, a printer, an audio output jack, a speaker, etc. In some embodiments, the input device 2006 and the output device 2008 may comprise a device configured for both input and output (e.g., a touch screen device) that can be used both to input information into the electronic system 2000 and to output visual information to a user. The one or more input devices 2006 and output devices 2008 may communicate electrically with at least one of the memory device 2002 and the electronic signal processor device 2004.

Accordingly, disclosed is an apparatus comprising at least one memory device. The at least one memory device comprises at least one doped surface of a base material. The at least one memory device also comprises at least one access transistor comprising a source region and a drain region. The at least one doped surface comprises a continuous doped surface extending directly between the source region and the drain region.

While the disclosed devices, structures, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. An apparatus, comprising:
   an access line extending into a base material, the access line separating a first region defined in the base material from a second region defined in the base material;
   a digit line extending through at least one dielectric material to the first region;
   a contact extending through the at least one dielectric material to the second region; and
   at least one doped surface of the base material, the at least one doped surface extending along at least a portion of one or more of the access line, the digit line, and the contact, the at least one doped surface comprising a dopant at a thickness not exceeding about one atomic layer.

2. The apparatus of claim 1, wherein the at least one doped surface comprises a doped surface extending, along a wall of the access line, between the first region and the second region.

3. The apparatus of claim 2, wherein the at least one doped surface further comprises another doped surface along an upper surface of the first region.

4. The apparatus of claim 3, wherein the at least one doped surface further comprises an additional doped surface along an upper surface of the second region.

5. The apparatus of claim 1, wherein the contact consists of one conductive material.

6. The apparatus of claim 1, wherein the contact comprises a conductive material within a polysilicon material.

7. The apparatus of claim 1, wherein the dopant comprises at least one of boron, phosphorous, indium, or arsenic.

8. The apparatus of claim 1, further comprising a third region separated from the first region by another access line.

9. The apparatus of claim 1, wherein the apparatus is a memory device.

10. The apparatus of claim 9, wherein the memory device is a dynamic random access memory (DRAM) device.

11. A method of forming an apparatus, comprising:
    within a material-removing tool, removing at least one portion of a base material to define at least one opening in the base material;
    also within the material-removing tool, doping exposed surfaces of the base material defining the at least one opening with a dopant to incorporate the dopant on or into the base material to form at least one doped surface of the base material, the at least one doped surface comprising the dopant at a thickness not exceeding about one atomic layer;
    forming an access line in the at least one opening, the access line extending into the base material, the access line separating a first region defined in the base material from a second region defined in the base material;
    forming at least one dielectric material above the access line;
    forming a digit line extending through the at least one dielectric material to the first region; and
    forming a contact extending through the at least one dielectric material to the second region,
    wherein the at least one doped surface extends along at least a portion of the access line.

12. The method of claim 11, wherein the doping follows completion of the removing of the at least one portion of the base material.

13. The method of claim 12, wherein a width of each of the at least one opening following the completion of the removing of the at least one portion of the base material remains the width following the doping.

14. The method of claim 11, wherein the doping comprises gas-phase doping.

15. The method of claim 11:
    further comprising, before removing the at least one portion of the base material, forming a doped region within the base material;
    wherein removing the at least one portion of the base material to define the at least one opening in the base material comprises defining access lines trenches through the doped region to define the first region and the second region; and
    wherein doping the exposed surfaces of the base material defining the at least one opening with the dopant comprises exposing vertical sidewalls of the first region and the second region to a precursor gas comprising the dopant.

16. The method of claim 11, further comprising, after the doping and before forming the access line in the at least one opening, forming a first dielectric material directly on at least some of the exposed surfaces of the base material to activate the dopant incorporated on or into the base material.

17. The method of claim 16, wherein forming the access line in the at least one opening comprises forming a gate region within the first dielectric material.

18. The method of claim 11, wherein forming the contact extending through the at least one dielectric material to the second region comprises:

forming an additional opening through the at least one dielectric material to expose an additional surface of the second region in the additional opening;

doping, with an additional dopant, the additional surface of the second region to incorporate the additional dopant on or into the second region to form an additional doped surface of the second region; and after the doping of the additional surface of the second region, forming a conductive material directly on the additional doped surface of the second region to substantially fill the additional opening.

19. The method of claim 18, wherein forming the conductive material directly on the additional doped surface of the second region is not preceded by forming another material directly on the additional doped surface of the second region.

20. A method of doping surfaces of a structure for an apparatus, comprising:
introducing, to a dry etching tool, a structure comprising a base material;
within the dry etching tool:
introducing an etchant gas to remove at least one portion of the base material to define therein at least one opening; and
introducing a precursor gas comprising a dopant to incorporate the dopant into exposed surfaces of the base material; and
exposing the dopant to heat to form a doped surface along the exposed surfaces of the base material, the dopant extending into the base material at a depth not exceeding about one atomic layer;
forming, in the at least one opening, an access line extending into the base material, the access line separating a first region defined in the base material from a second region defined in the base material;
forming at least one dielectric material above the access line;
forming a digit line extending through the at least one dielectric material to the first region; and
forming a contact extending through the at least one dielectric material to the second region,
wherein the doped surface extends along at least a portion of the access line, the doped surface comprising the dopant at a thickness not exceeding the about one atomic layer.

21. The method of claim 20, wherein introducing the precursor gas comprising the dopant comprises introducing a volatile boron-comprising gas or a volatile arsenic-comprising gas.

22. The method of claim 20, wherein introducing the etchant gas and introducing the precursor gas comprise introducing the precursor gas while introducing the etchant gas.

23. An apparatus, comprising:
at least one memory device comprising:
at least one doped surface of a base material; and
at least one access transistor comprising a source region and a drain region,
the at least one doped surface comprising a dopant concentrated at a continuous doped surface extending directly between the source region and the drain region, the continuous doped surface defining a thickness of the dopant of less than about one atomic layer.

24. The apparatus of claim 23:
wherein the at least one memory device further comprises at least one access line buried in the base material between the source region and the drain region,
the access line being isolated from the source region, the drain region, and the continuous doped surface.

* * * * *

UNITED STATES PATENT AND TRADEMARK OFFICE
CERTIFICATE OF CORRECTION

PATENT NO. : 11,088,147 B2  
APPLICATION NO. : 16/453788  
DATED : August 10, 2021  
INVENTOR(S) : Jaydip Guha et al.

It is certified that error appears in the above-identified patent and that said Letters Patent is hereby corrected as shown below:

In the Specification

| | | |
|---|---|---|
| Column 3, | Line 36, | change "functionless" to --junctionless-- |
| Column 4, | Line 14, | change "SOT" to --SOI-- |
| Column 7, | Line 51, | change "dioxide)" to --dioxide-- |
| Column 7, | Line 51, | change "silicon nitride)" to --silicon nitride-- |
| Column 17, | Line 61, | change "functionless" to --junctionless-- |

Signed and Sealed this  
Nineteenth Day of October, 2021

Drew Hirshfeld  
*Performing the Functions and Duties of the*  
*Under Secretary of Commerce for Intellectual Property and*  
*Director of the United States Patent and Trademark Office*